United States Patent
Zhu et al.

(10) Patent No.: US 9,957,159 B2
(45) Date of Patent: May 1, 2018

(54) SYSTEM AND METHOD FOR AN OVENIZED SILICON PLATFORM USING SI/SIO$_2$ HYBRID SUPPORTS

(71) Applicant: Evigia Systems, Inc., Ann Arbor, MI (US)

(72) Inventors: Weibin Zhu, Saline, MI (US); Navid Yazdi, Ann Arbor, MI (US)

( * ) Notice: Subject to any disclaimer, the term of this patent is extended or adjusted under 35 U.S.C. 154(b) by 0 days. days.

(21) Appl. No.: 15/470,670

(22) Filed: Mar. 27, 2017

(65) Prior Publication Data
US 2017/0275157 A1    Sep. 28, 2017

Related U.S. Application Data

(60) Provisional application No. 62/390,385, filed on Mar. 28, 2016, provisional application No. 62/390,440, filed on Mar. 30, 2016.

(51) Int. Cl.

| | |
|---|---|
| *H01L 31/058* | (2006.01) |
| *H01L 21/76* | (2006.01) |
| *H01L 21/302* | (2006.01) |
| *H01L 21/461* | (2006.01) |
| *B81C 1/00* | (2006.01) |
| *H01L 27/12* | (2006.01) |
| *B81B 7/00* | (2006.01) |

(52) U.S. Cl.
CPC .......... *B81C 1/0069* (2013.01); *B81B 7/0019* (2013.01); *H01L 27/1207* (2013.01); *B81B 2201/0228* (2013.01); *B81B 2201/0278* (2013.01); *B81B 2207/07* (2013.01); *B81B 2207/99* (2013.01); *B81C 2201/0126* (2013.01); *B81C 2201/0132* (2013.01)

(58) Field of Classification Search
CPC .. B81C 1/0069; B81B 7/0019; H01L 27/1207
USPC .......................... 257/467; 438/424, 427, 712
See application file for complete search history.

(56) References Cited

U.S. PATENT DOCUMENTS

| | | | | |
|---|---|---|---|---|
| 7,803,646 | B2 * | 9/2010 | Fischer | B81C 1/0069 |
| | | | | 257/E21.564 |
| 2003/0134445 | A1 * | 7/2003 | Kubby | G02F 1/025 |
| | | | | 438/31 |

FOREIGN PATENT DOCUMENTS

DE         10306129 A1 *  8/2004  .......... B81C 1/0069

* cited by examiner

*Primary Examiner* — David S Blum
(74) *Attorney, Agent, or Firm* — James M. Smedley LLC; James Michael Smedley, Esq.

(57) ABSTRACT

The present invention generally relates to an ovenized platform and a fabrication process thereof. Specifically, the invention relates to an ovenized hybrid Si/SiO$_2$ platform compatible with typical CMOS and MEMS fabrication processes and methods of its manufacture. Embodiments of the invention may include support arms, CMOS circuitry, temperature sensors, IMUs, and/or heaters among other elements.

20 Claims, 23 Drawing Sheets

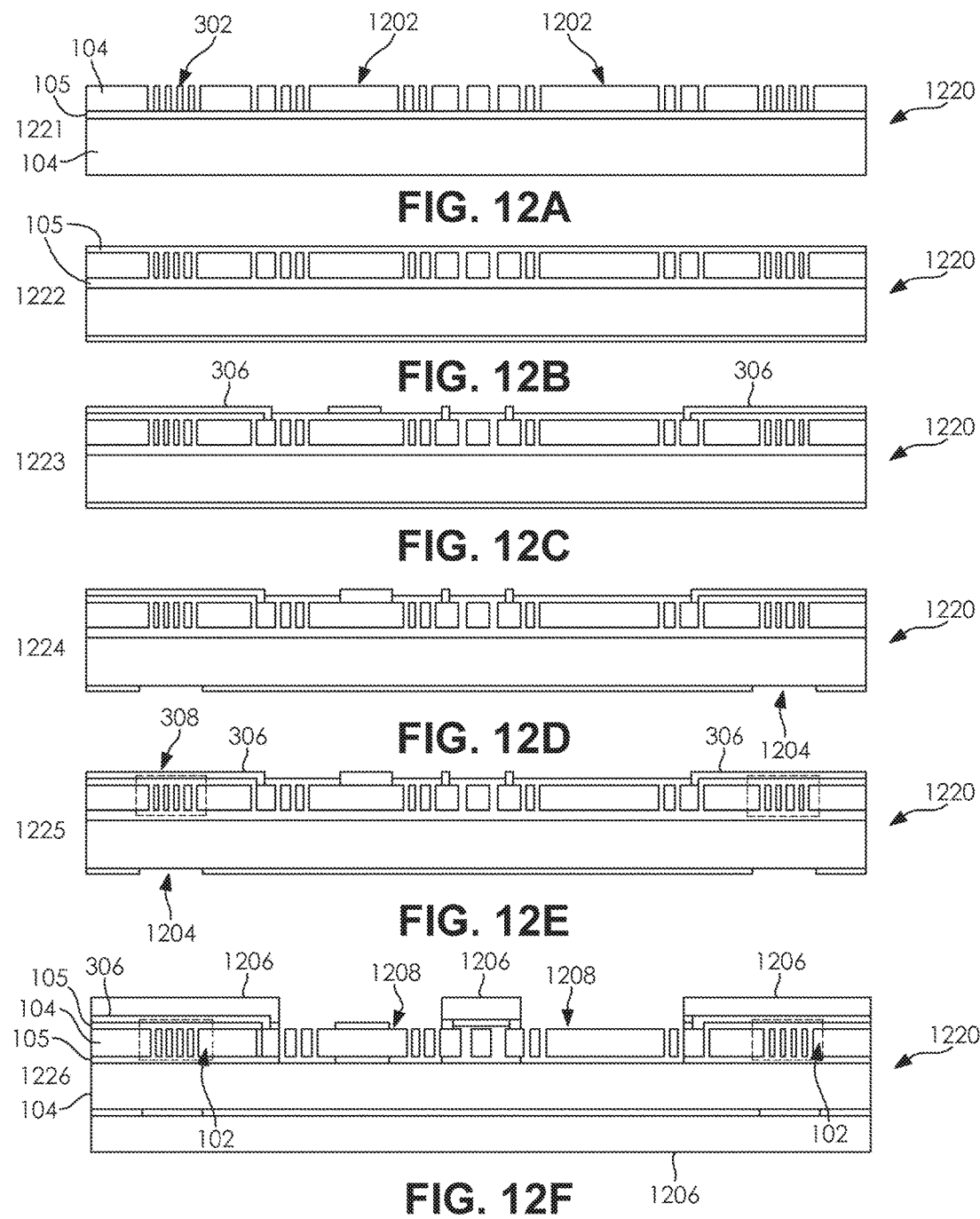

SYSTEM AND METHOD FOR AN OVENIZED SILICON PLATFORM USING SI/SIO$_2$ HYBRID SUPPORTS

CROSS-REFERENCE TO RELATED APPLICATIONS

This application claims the benefit of U.S. Provisional Patent Application No. 62/390,440, filed on Mar. 30, 2016, and U.S. Provisional Patent Application No. 62/390,385, filed on Mar. 28, 2016, both of which are hereby incorporated by reference in their entirety.

GOVERNMENT SUPPORT

This invention was made with government support under contract number: W911NF-15-P-0049 awarded by US Army on behalf of Defense Advanced Research Projects Agency (DARPA). The government has certain rights in the invention.

FIELD OF THE INVENTION

The present invention generally relates to an ovenized silicon platform and a method for its manufacture and packaging. Specifically, the invention relates to a hybrid Si/SiO$_2$ platform structure with supports and method of fabrication thereof. Embodiments of the invention are configured to operate an electronic device, sensor, or resonator at a fixed temperature resulting in a high stability and accuracy of operation thereof across varying environmental temperature conditions.

BACKGROUND OF THE INVENTION

The technical performance requirements of microelectromechanical systems (MEMS) inertial measurement units (IMUs) have been challenging to meet for military, aerospace and high-end industrial and commercial market applications. Such high-end performance goals are, for example, that the bias and scale factor stability of the IMUs should be better than 1°/hr and 10 ppm for a gyroscope and better than 1 mg and 1 ppm for an accelerometer across a −40° C. to +85° C. temperature range.

Using an ovenized platform is intended to improve a given device's performance stability by holding the device at a relatively uniform stable temperature in a vacuumed enclosure. Such an approach isolates the devices from the environmental changes and facilitates the achievement of the abovementioned high performance goals. Over the past two decades, utilizing long suspended silicon support structures has become a common approach in MEMS fabrication in an attempt to provide the desired thermal isolation for a suspended silicon platform. However, this approach is often plagued with a number of drawbacks and limitations. For instance, due to the high thermal conductivity of silicon, in order to achieve the thermal isolation requirements necessary for the accurate performance of an IMU, the suspended silicon structures need to be very long and compliant and are, therefore, not very suitable for inertial sensing applications.

Additionally, until now, a glass substrate has been used to facilitate thermal isolation in the fabrication of the ovenized platform due to the very low thermal conductivity of SiO$_2$. However, the deficiency of this method is that the fabrication process of a glass platform is typically not compatible with standard complementary metal-oxide-semiconductor (CMOS) and MEMS manufacturing processes. Sensor and platform integration can often be achieved on a die-level assembly making glass an impractical substrate. Furthermore, although there is a requirement for the temperature gradient inside the platform is to be minimized, such a requirement is difficult to meet with a low-conductivity material such as glass. Further, the thermal mismatch between glass platform and mounted sensor can potentially cause large stress when the platform form temperature increases.

Accordingly, there is a need in the art for an ovenized silicon platform with high technical performance specifications. More specifically, there is a need for a micro-oven platform incorporating a MEMS IMU providing high-temperature isolation as well as low-displacement and high-shock survival in the face of environment vibrations and mechanical impacts with unprecedented bias and scale factor stability that is fully compatible with accepted CMOS and MEMS fabrication processes. These and other features and advantages of the present invention will be explained and will become obvious to one skilled in the art through the summary of the invention that follows.

SUMMARY OF THE INVENTION

In the present invention, a generic micro-ovenization and high precision temperature-controlled Si platform is provided. This platform achieves an unprecedented bias and scale factor stability for MEMS inertial sensors by employing an innovative micro-oven platform and precise oven-temperature controls as described herein. The present silicon micro-oven platform is fully-compatible with commonly used CMOS and MEMS fabrication processes. It also provides high temperature isolation in addition to low displacement as well as high-shock tolerance and survival in the event of environment vibrations and mechanical impacts. The present invention incorporates a high-precision micro-oven temperature control to achieve temperature control precision of 0.01° C. or less using various techniques to integrate temperature sensors and heaters, including using thin film low-cost deposited resistors in standard MEMS and integrated circuit (IC) fabrication processes, using IC fabrication processes with built-in temperature sensors or commercial surface mount temperature resistors. In this manner, the present invention provides versatile high-yield fabrication and packaging processes that are suitable for both wafer-level sensor fabrication and die level sensor assembly.

According to an embodiment of the present invention, an ovenized silicon platform comprises: at least one silicon layer, at least one silicon oxide layer, a hybrid Si/SiO2 platform support structure, wherein said support structure is formed by depositing silicon oxide within trenches formed by a deep reactive ion etching of a silicon layer to create alternating layers of silicon and silicon oxide configured to thermally isolate the platform from temperature fluctuations, and at least one thin-film electrical interconnect displaced on the top surface of said platform.

According to an embodiment of the present invention, the platform comprises at least one element selected from the group comprising CMOS circuitry, thermal sensor, heater, and inertial sensor. In an embodiment of the present invention the alternating layers of silicon and silicon oxide within the platform support structure are separated by a layer of silicon nitride. Additionally, in an embodiment of the present invention at least one silicon layer is a device layer of a silicon-on-isolator wafer.

According to an embodiment of the present invention, the platform comprises at least one thermal sensor and at least one heater wherein said at least one thermal sensor and said at least one heater are each positioned within a layer of silicon. The platform may also comprise at least one thermal sensor and at least one heater wherein said at least one thermal sensor and said at least one heater are each positioned on the top surface of said platform in accordance with an embodiment of the present invention. Additionally, in an embodiment of the present invention the thin-film electrical interconnect is a trace comprising metal or polysilicon.

According to an embodiment of the present invention, a method for fabricating an ovenized silicon platform comprises the steps of: deep-reactive-ion-etching trenches into a layer of silicon on one side of said platform, forming a recess on a side of the platform opposite to that of said trenches, depositing a layer of oxide onto a top layer of the platform to refill said trenches; attaching conductive traces onto a surface of the platform, and patterning a platform support structure that provides thermal isolation for the platform, releasing said support structure.

According to an embodiment of the present invention, the method also comprises the step of integrating CMOS circuitry with the platform. In another embodiment, the method may also include the steps of depositing a first layer of nitride onto a layer of silicon prior to depositing a layer of oxide on a top layer of the platform, and then depositing a second layer of nitride onto the layer of oxide to create a layer of oxide sandwiched between layers of nitride deposited on a top surface of the platform. The method for fabricating an ovenized silicon platform may further comprise the steps of patterning the silicon oxide layer to create depressions therein, and encapsulating said depressions with nitride during the deposition of the second layer of nitride to create lateral etch stops.

According to an embodiment of the present invention, the method for fabricating an ovenized silicon platform comprises the steps of: defining at least one inertial sensor along with said trenches during the deep-reactive-ion-etching step, releasing said at least one inertial sensor, fitting a sensor cap over said at least one inertial sensor, fitting a top cap on a top surface of said platform, and fitting a bottom cap on a bottom surface of said platform. In an embodiment of the present invention the method may further comprise the step of integrating CMOS circuitry with the platform.

According to an embodiment of the present invention, the method for fabricating an ovenized silicon platform may comprise the steps of: attaching at least one of an unpackaged sensor or a packaged sensor to a top surface of the platform, attaching said platform within an electronic chip package, and covering said package with a lid. In an embodiment of the present invention the method may further comprise the steps of: vacuum sealing said ceramic package, and attaching a sensor by either flip-chip bonding, eutectic bonding, or wirebond connection.

The foregoing summary of the present invention with the preferred embodiments should not be construed to limit the scope of the invention. It should be understood and obvious to one skilled in the art that the embodiments of the invention thus described may be further modified without departing from the spirit and scope of the invention.

BRIEF DESCRIPTION OF THE DRAWINGS

FIGS. 12A-12J show a cross-sectional view of the steps of a platform fabrication process flow integrating inertial sensors with an ovenized platform in accordance with another embodiment of the present invention;

DETAILED SPECIFICATION

In the Summary above, in the Detailed Specification, the Claims below, and in the accompanying drawings, reference is made to particular features including method steps of the invention. It is to be understood that the disclosure of the invention in this specification includes all possible combinations of such particular features. For example, where a particular feature is disclosed in the context of a claim, that feature can also be used to the extent possible, in combination with and/or in the context of other particular aspects and embodiments of the invention and in the invention generally.

The term "comprises" and grammatical equivalents thereof are used herein to mean that other components, ingredients, steps, etc. are optionally present. For example, an article "comprising" (or "which comprises") components A, B, and C can consist of (i.e. contain only) components A, B, and C or can contain not only components A, B, and C but also one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context exclude that possibility).

Embodiments of the present invention generally relate to an ovenized platform and a fabrication process thereof. Specifically, the invention relates to an ovenized hybrid Si/SiO$_2$ platform compatible with typical CMOS and MEMS fabrication processes and methods of its manufacture. Certain embodiments of the invention may include support arms, CMOS circuitry, temperature sensors, IMUs, and/or heaters among other elements.

The disclosed platform as well as its fabrication and packaging methods enable precise temperature control and thermal isolation from the environment for the sensors, IMUs, or other devices incorporated thereon. Generally, the operation of the oven at fixed temperatures is achieved by at least a precise temperature sensor and at least a heater on a Si platform supported by hybrid Si/SiO$_2$ support arms. The silicon layer has a high thermal-conductance that allows for a highly-uniform temperature across the platform. A control loop that is connected to the temperature sensor as well as the heater is utilized to obtain a high-accuracy stable fixed oven temperature. In order to minimize the heat loss due to convection, in a preferred embodiment of the present invention the platform is preferably packaged in a vacuum environment.

Figure 1A:
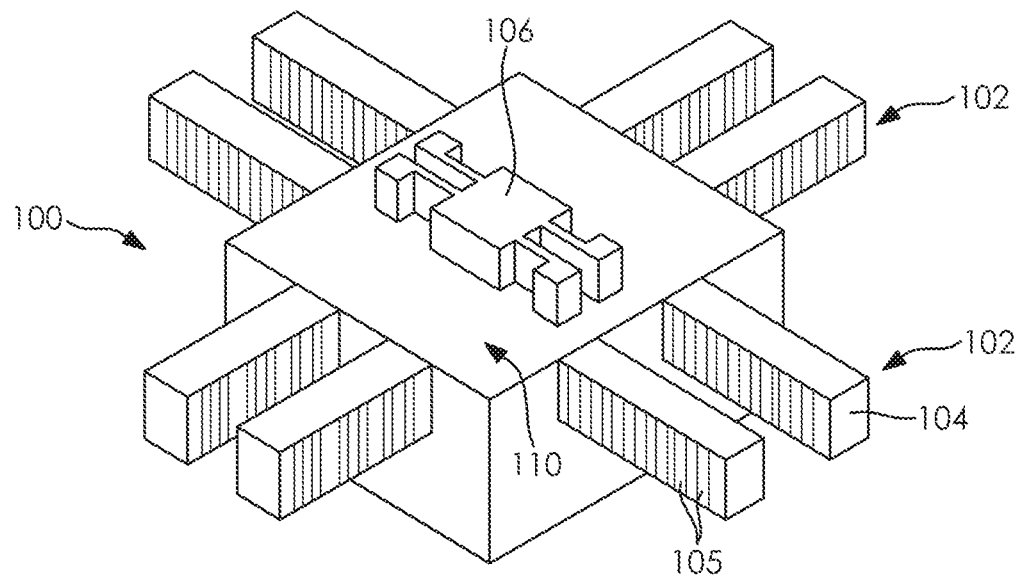
FIG. 1A is a perspective view of an platform with Si/SiO$_2$ hybrid structure comprising a straight beam support arm design in accordance with an embodiment of the present invention.
Figure 1B:
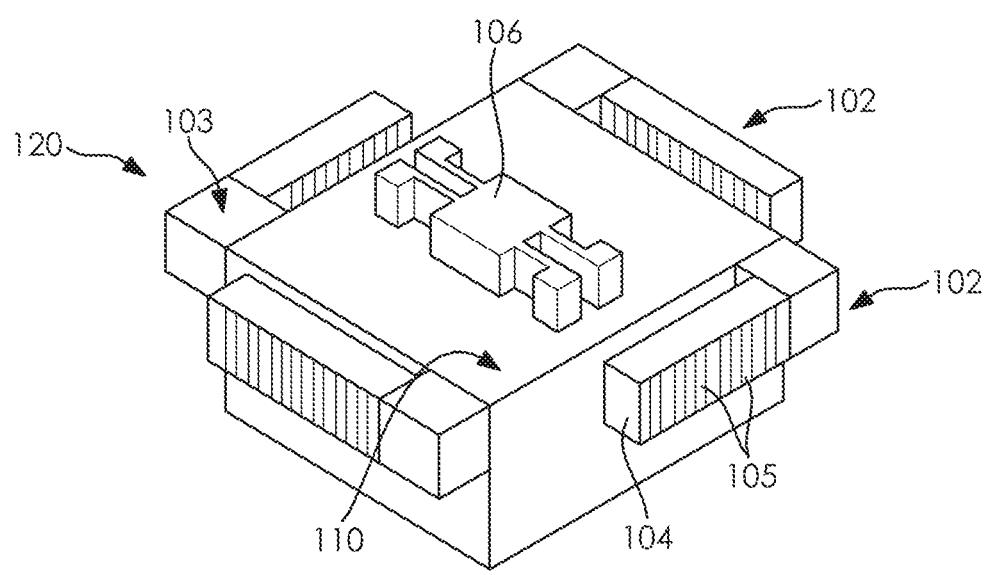
FIG. 1B is a perspective view of an platform with Si/SiO$_2$ hybrid structure comprising a crab-leg support arm design in accordance with an embodiment of the present invention.

A preferred embodiment 100 of the invention, shown in FIG. 1, employs a silicon platform 110 with a Si/SiO$_2$ hybrid structure. In this embodiment, the platform 110 has a sufficient thickness to ensure stability, a high level of thermal isolation for low-power operation, and rigid support beams 102 for resilience against shock or vibration. It should be understood by a person skilled in the art that the particular internal and exterior design and number of the Si/SiO$_2$ support arms 102 can vary based on the design requirements and that the various embodiments the invention discussed herein can incorporate any variation or configuration thereof. For example, the geometric design of each support arms can be that of a straight beam structure 101 as shown in FIG. 1A, a crab-leg structure 103 as shown in FIG. 1B, or any of a variety other geometric designs that are determined to be optimal based on design specifications and fabrication considerations in each instance. Other geometric designs that utilize the Si/SiO$_2$ hybrid structure are also feasible to provide good thermal isolation of the platform 110 structure.

Figure 2A:
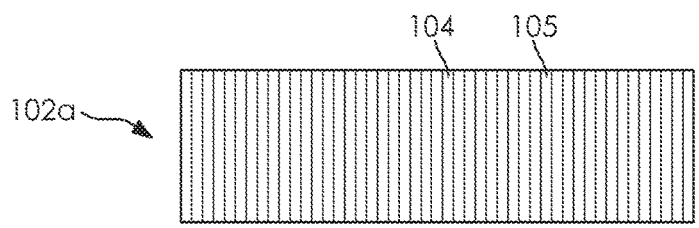
FIGS. 2A-2B are top view illustrations of two alternative designs of the alternating Si/SiO$_2$ pattern of the support arms in accordance with embodiments of the present invention.
Figure 2B:
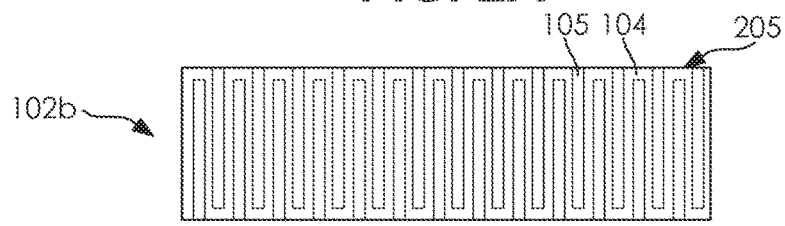

Two design examples of the proposed Si/SiO$_2$ hybrid support arms 102 are illustrated in FIG. 2. The formation of either alternative is achieved by SiO$_2$ 105 deposition filling trenches between the planar Si 104 structures created by the etching of the Si substrate 104. In one particular embodiment, FIG. 2A shows a top view of an exemplary design of a platform support arm 102*a* comprised of alternating Si 104 and SiO$_2$ 105 stripes formed by this process. In an alternative embodiment of a support arm 102*b*, a Si 104 meandering structure 205 is filled with SiO$_2$ 105 as shown in FIG. 2B. The SiO$_2$ deposition process used in the creation of the support arms 102 can be selected from any silicon oxide deposition methods including, but not limited to, low-pressure chemical vapor deposition (LPCVD), plasma-enhanced chemical vapor deposition (PECVD), and thermal oxide deposition. It should be understood that during operation there will be a temperature gradient across the length of each of the arms 102 as they act to thermally isolate the platform 110 from the ambient environment. The length and shape of each of the support arms 102 can vary between the embodiments of the present invention and are determined by the desired thermal isolation levels and sensor performance, as well as by the fabrication process requirements.

Figure 3A:
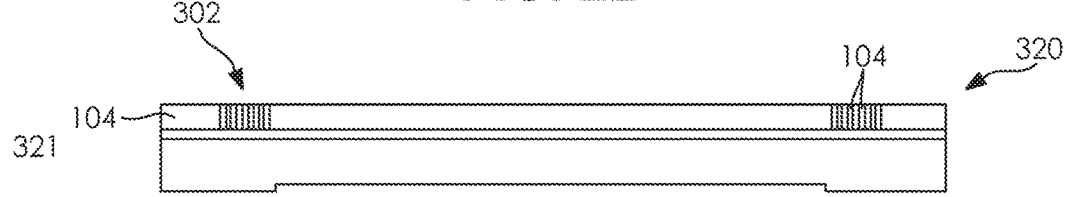
FIGS. 3A-3E show a cross-sectional view of the steps of a platform fabrication process flow in accordance with an embodiment of the present invention.
Figure 3B:
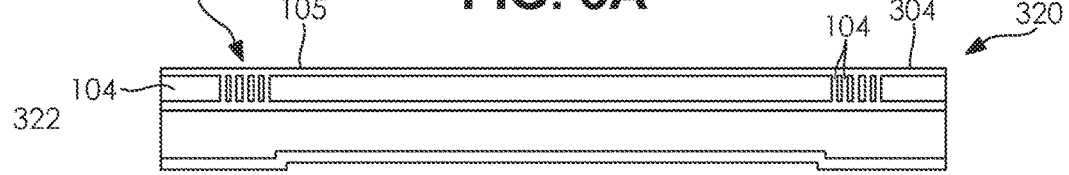
Figure 3C:
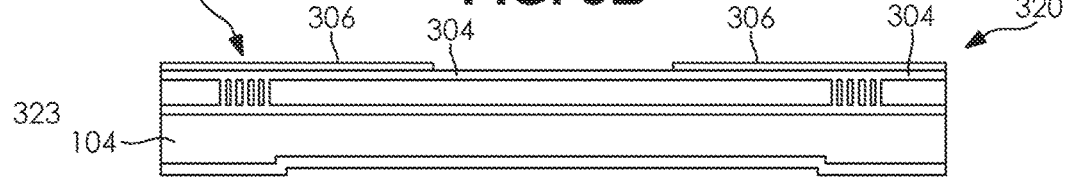
Figure 3D:
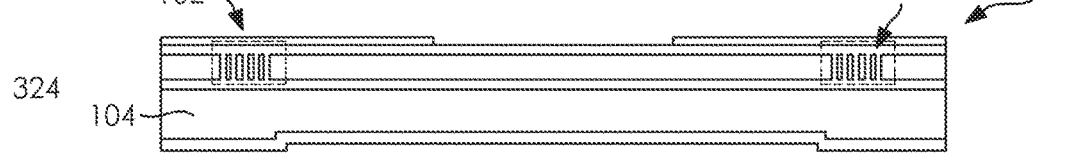
Figure 3E:

FIGS. 3A-3E show an exemplary fabrication process flow (referred to as "design A1" herein) for the Si/SiO$_2$ hybrid ovenized platform 320 using a silicon-on-insulator (SOI) wafer process and a deep reactive ion etching (DRIE) of the Si 104 to release the platform 320, in accordance with an embodiment of the present invention. The Si/SiO$_2$ hybrid support arm 102 structure is realized by refilling SiO$_2$ 105, in step (b) 322 shown in FIG. 3B into trenches 302 created within the upper layer of Si 104 in step (a) 321 shown in FIG. 3A. A thin-film electrical interconnect layer such as metal or poly-Si traces 306 may be added on top of the refilled SiO$_2$ 105 layer 304 in step (c) 323 shown in FIG. 3C. The support arms 102 may optionally then be patterned and defined 308 by deep reactive ion etching (DRIE) in step (d) 324 shown in FIG. 3D. Step (d) 324 can be skipped if the Si/SiO$_2$ hybrid structure 102 is designed in a ring-like or perimetral structure surrounding the Si 104 platform. As can be seen in FIG. 3E, the platform is finally released 310 in step (e) 325 by performing DRIE on the reverse side of the platform. It should be understood that in this embodiment as well as elsewhere in the Figures and other embodiments, the dotted line is meant to indicate areas located behind of or in front of the plane visible in the cross-sectional view. Accordingly, these ovenized platform fabrication process steps are fully compatible with and can be incorporated within standard IC fabrication processes. One skilled in the art should understand that the order of the intermediate steps may be interchangeable in this process as well as the processes disclosed below.

Figure 4A:
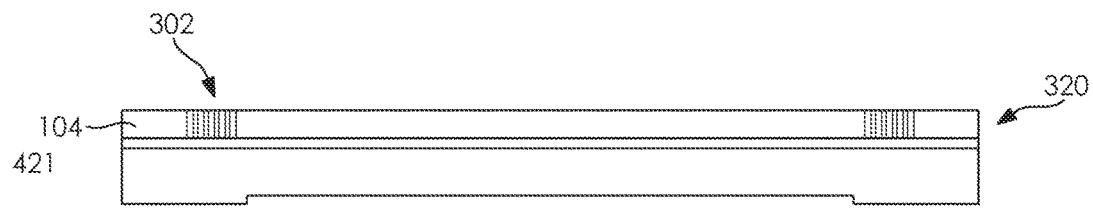
FIGS. 4A-4E show a cross-sectional view of the steps of a platform fabrication process flow incorporating a standard CMOS integration process in accordance with an embodiment of the present invention.
Figure 4B:
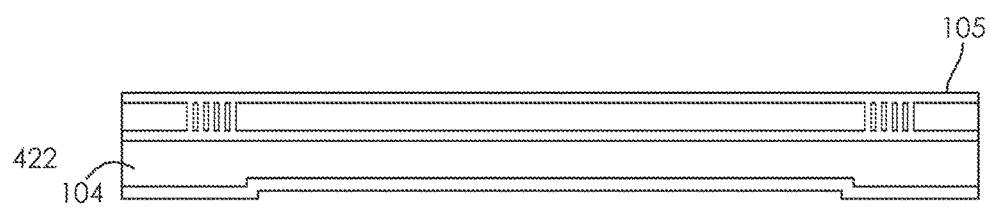
Figure 4C:
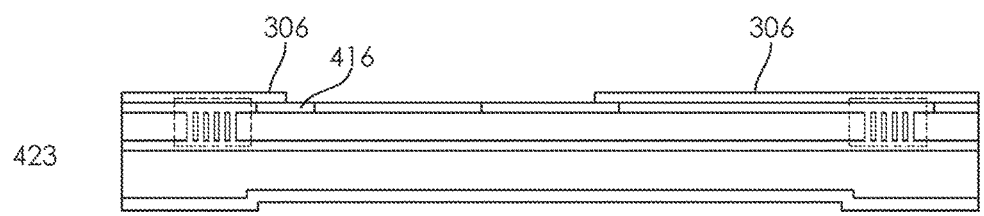
Figure 4D:
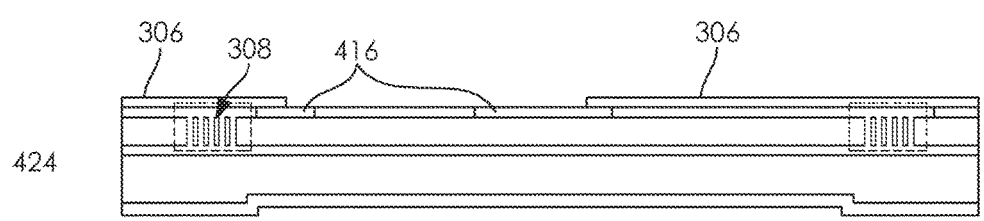
Figure 4E:
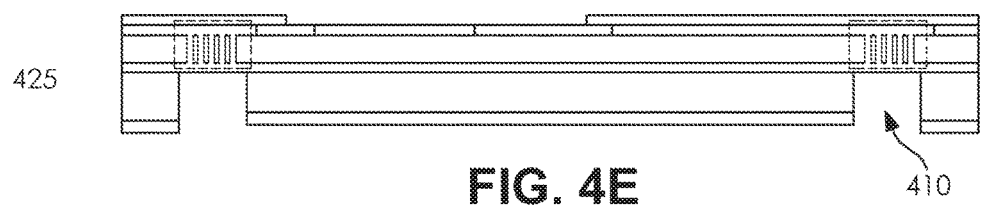

Turning now to FIGS. 4A-4E, an exemplary fabrication process flow is shown in accordance with an embodiment of the present invention (referred to as "design A2" herein) 420 which is a variation of design A1 320 described above but additionally incorporates a standard CMOS integration process. Accordingly, steps (a) 421 and (b) 422, illustrated here in FIGS. 4A and 4B, are identical to those seen in FIGS. 3A and 3B respectively. The standard CMOS circuitry incorporation process is completed in step (c) 423, shown in FIG. 4C which occurs after the oxide 105 refill in step (b) 422, shown in FIG. 4B. In this embodiment of the process flow, instead of using DRIE to release the platform in the final step (e) 425, seen in FIG. 4E, alternatively, a buffered hydrofluoric (BHF) or hydrofluoric (HF) vapor release 410 can be used to achieve a similar platform structure as that shown in FIG. 3 for design A1 320. In this embodiment, CMOS circuitry 306 can be integrated on or off the platform.

Figure 5A:
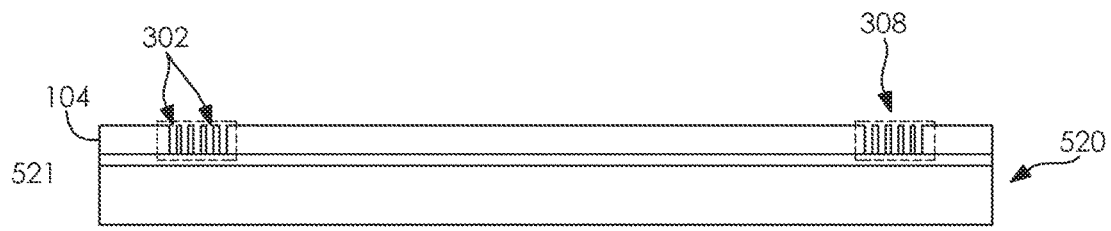
FIGS. 5A-5G show a cross-sectional view of the steps of a platform fabrication process flow in accordance with another embodiment of the present invention.
Figure 5B:
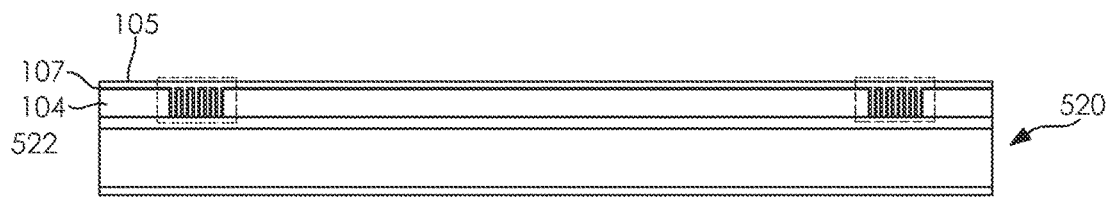
Figure 5C:
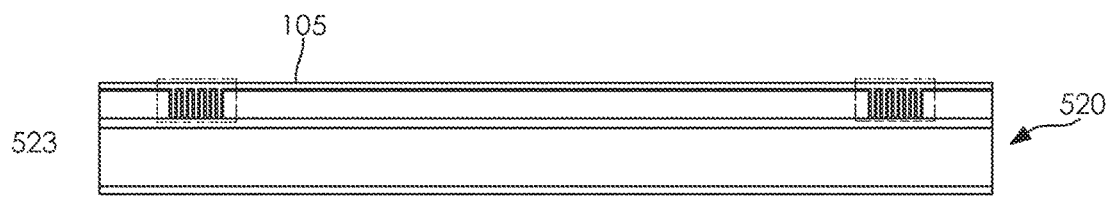
Figure 5D:
Figure 5E:
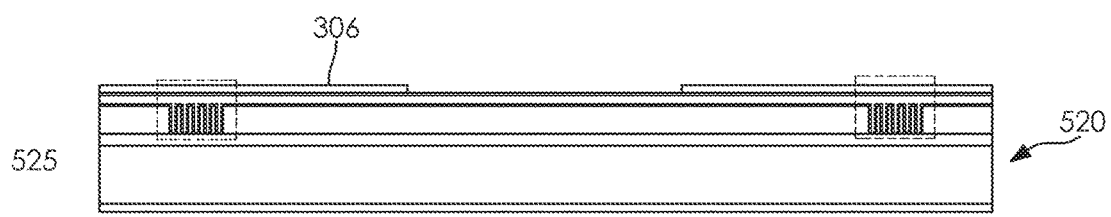
Figure 5F:
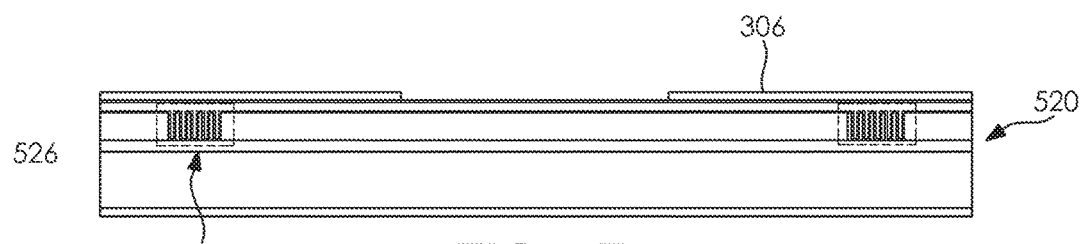
Figure 5G:
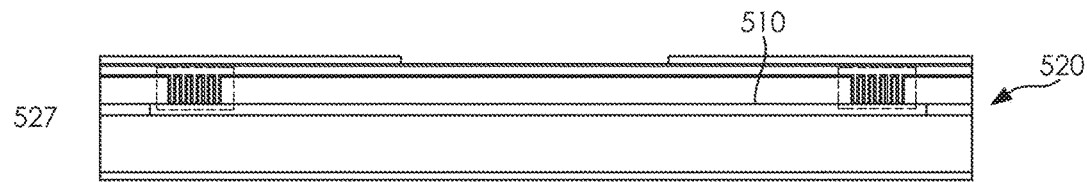

FIGS. 5A-5G illustrate yet another variation of a fabrication process flow (referred to as "design B1" herein) to fabricate the platform 520 using silicon oxide release in accordance with an embodiment of the present invention. While step (a) 521, shown in FIG. 5A, is identical to those described in the previous two exemplary process flows, the remaining steps differ in this embodiment. After the initial DRIE process in step (a) 521, step (b) 522 comprises first depositing a layer of silicon nitride 107 and then depositing a layer of silicon oxide 105 thereon, thereby effectively filling the DRIE-created trenches 302 as well as layering the planar surface of the platform 520 as depicted in FIG. 5B. A second silicon nitride 107 layer is deposited in step (d) 524 to cover the oxide 105 layer and sandwich it between two layers of nitride 107. In this exemplary fabrication process, areas 504 for release, located behind and in front of the visible plane in the dotted region, are formed by removal of the nitride 107 layer in step (f) 526, shown in FIG. 5F, when the support arms 102 are patterned 308. In step (c) 523, depicted in FIG. 5C, the support arm pattern may be etched (if not already patterned) and the subsequently exposed buried oxide 105 in those etched areas is removed by reactive ion etching (RIE). In this step, while not visible in this cross sectional view, the removal of the Si 104 and thereafter of the buried silicon oxide 105 occurs primarily in the area occupied by the gaps between the support arms 102 depicted in FIGS. 1A-1B. It should be obvious and understood by one skilled in the art that FIGS. 5A-5G only show one variation of such a manufacturing process flow design and that the support arm 102 patterning 308 step can either be completed in step (a), as shown in FIG. 5A, or right before the oxide release 510 occurs in step (g) 527 seen in FIG. 5G. Similarly, as was the case with designs A1 320 and A2 420, design B1 520 is also fully compatible with and integrable within standard IC fabrication processes.

Figure 6A:
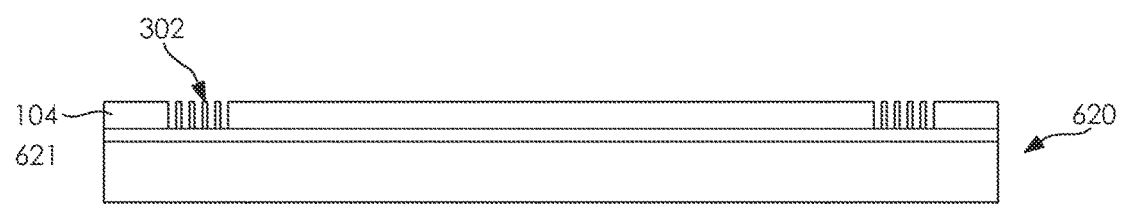
FIGS. 6A-6H show a cross-sectional view of the steps of a platform fabrication process flow incorporating a standard CMOS integration process in accordance with another embodiment of the present invention.
Figure 6B:
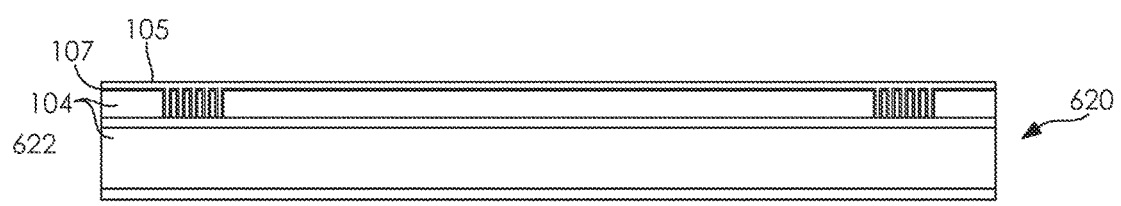
Figure 6C:
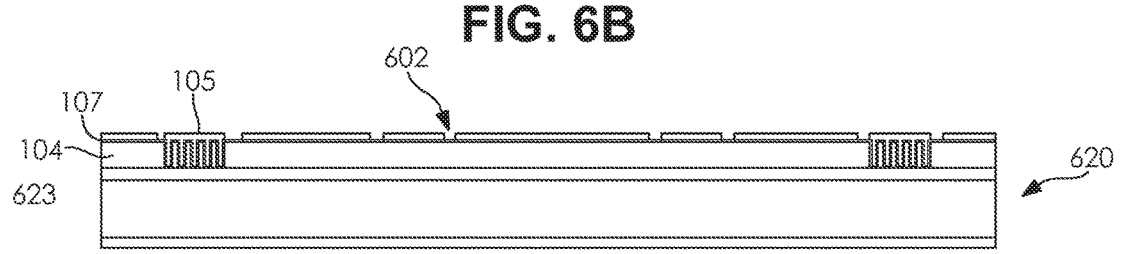
Figure 6D:
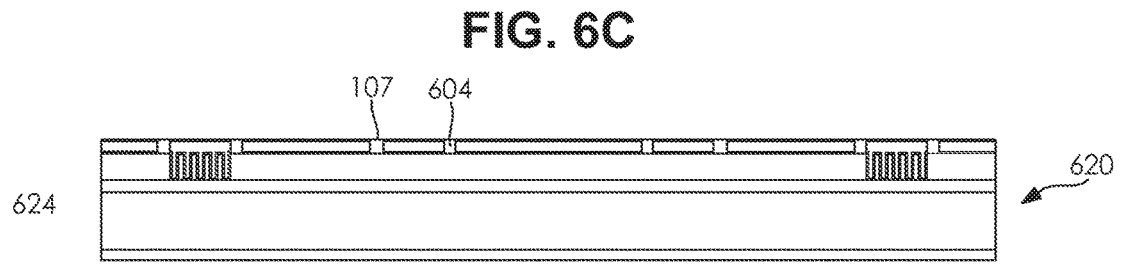
Figure 6E:
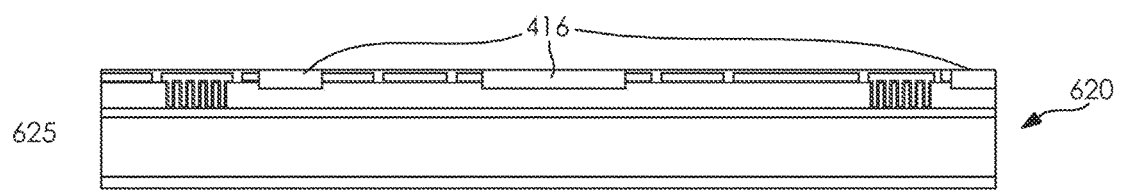
Figure 6F:
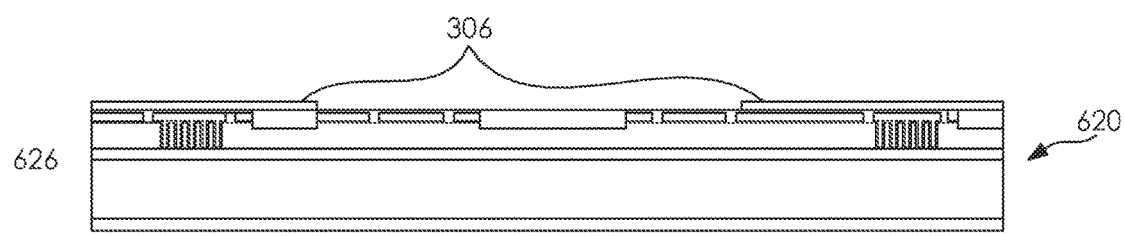
Figure 6G:
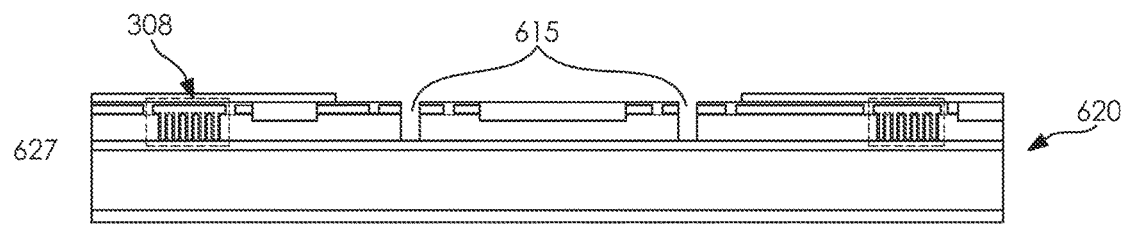
Figure 6H:
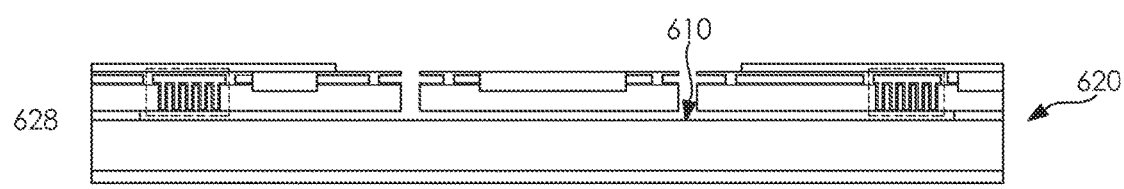

FIGS. 6A-6H show yet another variation of a fabrication process flow (referred to as "design B2" herein) 620 which is similar to design B1 520 but also incorporates a standard CMOS 416 integration process. In this flow, a variation of the manufacturing process is shown wherein DRIE trenches 302 are created in step (a) 621 and additional release holes 615 are created on the ovenized platform in step (g). In this process, the silicon nitride 107 oxide 105 nitride 107 alternating layers are deposited separately in steps (b) 622, (c) 623, and (d) 624 respectively, as seen in FIGS. 6B-6D, to then form lateral etch stops 604 made in the top layer of nitride 107 in step (d) 624 shown in FIG. 6D. To achieve the structure of the nitride 107 lateral etch stops 604, first, the middle oxide 105 layer is patterned by etching to provide the depressions 602 within which the etch stops 604 will be formed upon the deposition of the second nitride 107 layer. These lateral etch stops 604 provide a complete seal of the refill oxide 105 and ensure the Si/SiO$_2$ structure is not attacked in the final oxide release step (h) 628. Then, CMOS circuitry 416 is added in step (e) 625, shown in FIG. 6E, and thin-film electrical interconnects such as metal or poly-Si traces 306 are added on the top surface of the platform 620 in step (f) 626, shown in FIG. 6F. Support arms are patterned 308 in step (g) 627 after the standard CMOS circuitry 416 integration process is completed as shown in FIG. 6G. The optional additional release holes 615 may also be etched in step (g) 627. These release holes 615 serve to further reduce the total release time of the oxide-release 610 occurring in step (h) 628, shown in FIG. 5H, and thus speed up the fabrication process.

Figure 7A:
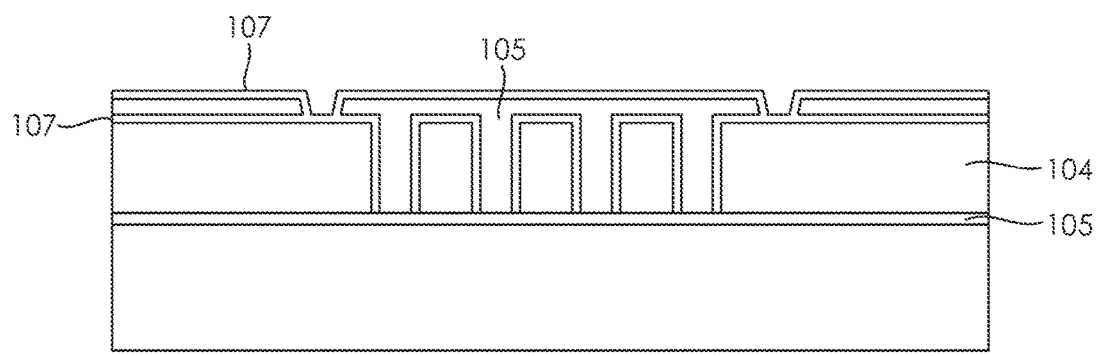
FIG. 7A illustrates cross-sectional view of a steps of a Si/SiO$_2$ hybrid support arm along the heat conduction path in accordance with an embodiment of the present invention.
Figure 7B:
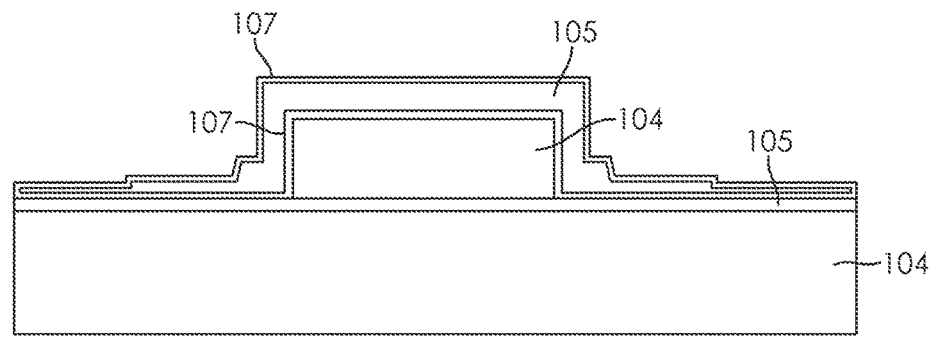
FIG. 7B illustrates cross-sectional view of a steps of a Si/SiO$_2$ hybrid support arm perpendicular to the heat conduction path in accordance with an embodiment of the present invention.

FIGS. 7A-7B illustrate a more detailed view of the Si/SiO$_2$ hybrid structure achieved in step (d) 624 of design B2 620. As shown in FIG. 7A, which is a cross-section along the heat conduction path, and in FIG. 7B, which is a cross-section perpendicular to the conduction path, the refilled oxide 105 layer is protected by the top and bottom layers of nitride 107 and therefore will not be attacked in the oxide release step. In this manner, the geometry of this configuration coupled with the two layers of silicon nitride 107 protects Si/SiO$_2$ hybrid structure from the subsequent oxide release steps. While the silicon nitride 107 may have a higher thermal conductivity than silicon oxide 105, the nitride 107 layer is preferably made very thin (≤1000 Å) so as to ensure that the heat conduction of the thin film nitride is negligible.

Figure 8A:
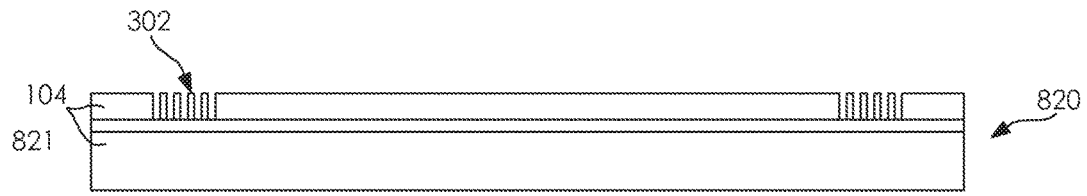
FIGS. 8A-8G show a cross-sectional view of the steps of a platform fabrication process flow in accordance with an embodiment of the present invention.
Figure 8B:
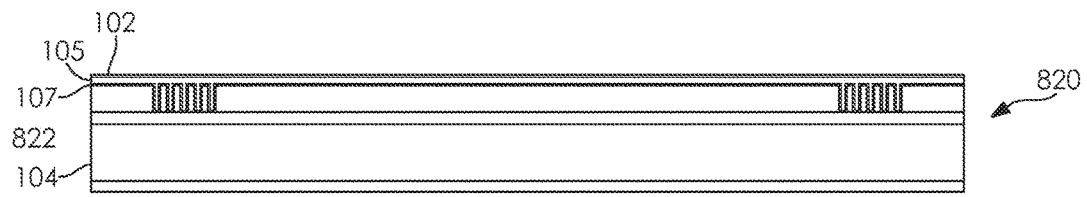
Figure 8C:
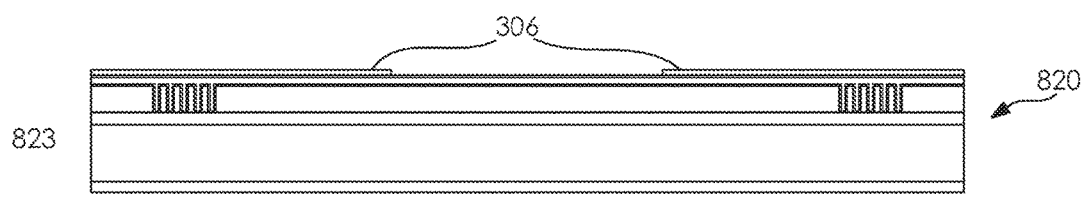
Figure 8D:
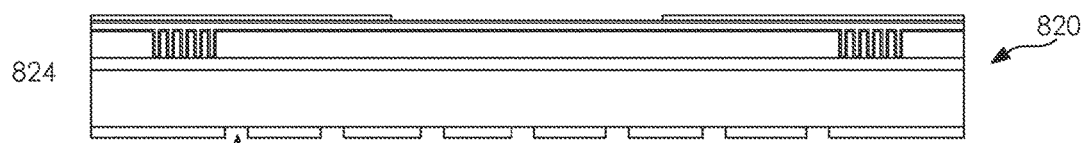
Figure 8E:
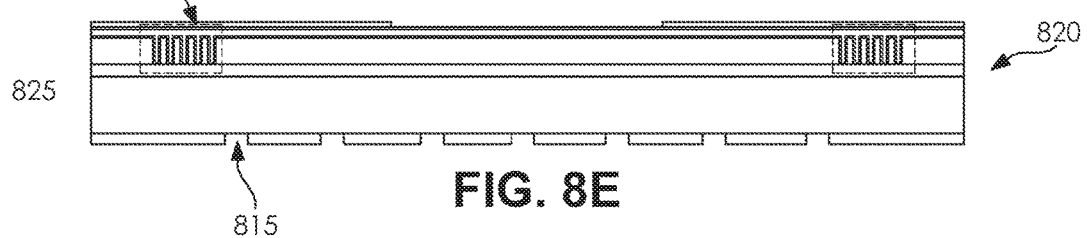
Figure 8F:
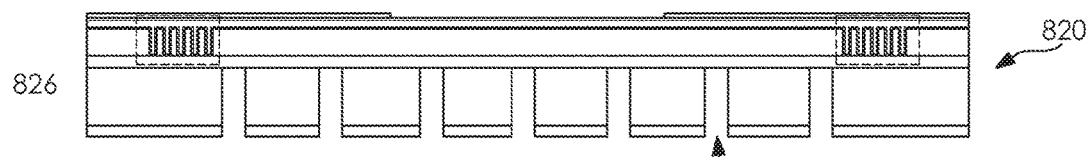
Figure 8G:
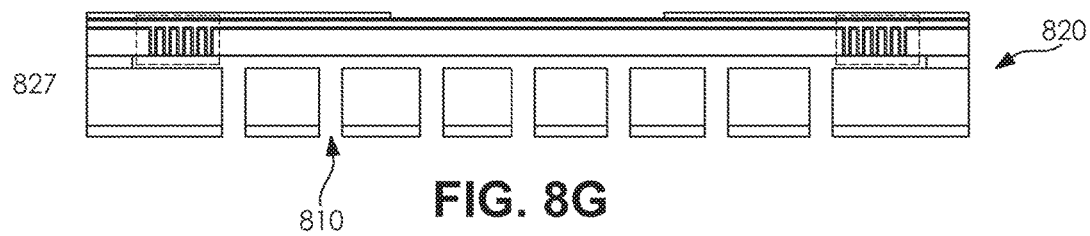
Figure 9A:
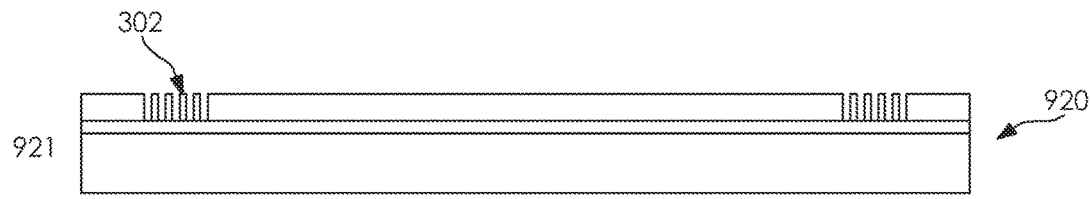
FIGS. 9A-9H show a cross-sectional view of the steps of a platform fabrication process flow incorporating a standard CMOS integration process in accordance with another embodiment of the present invention.
Figure 9B:
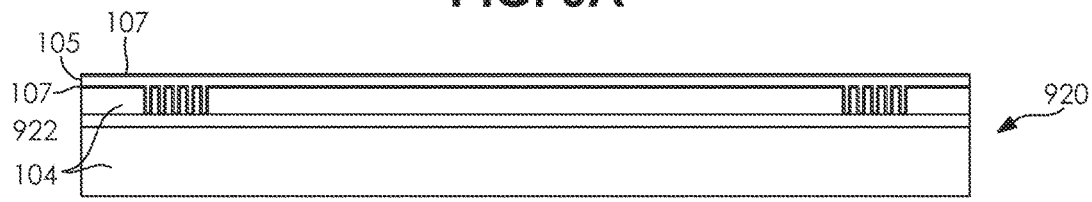
Figure 9C:
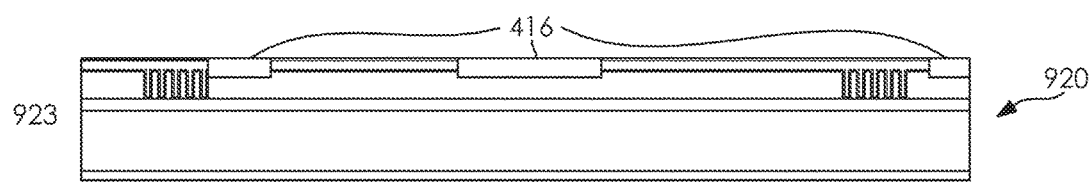
Figure 9D:
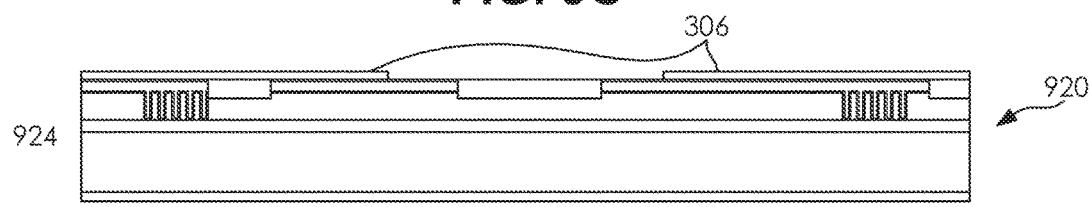
Figure 9E:
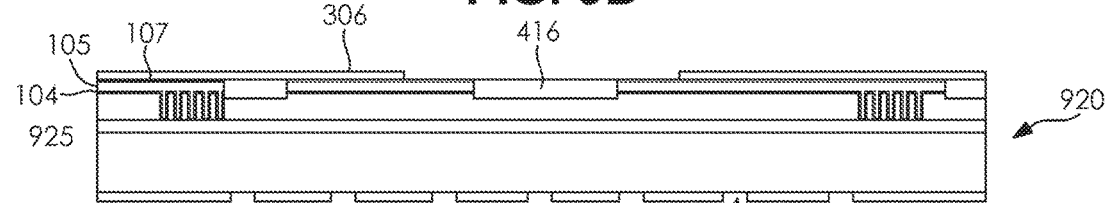
Figure 9F:
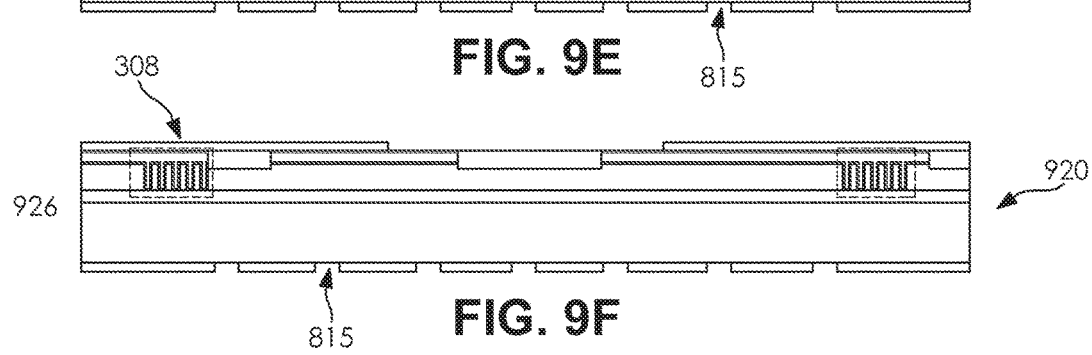
Figure 9G:
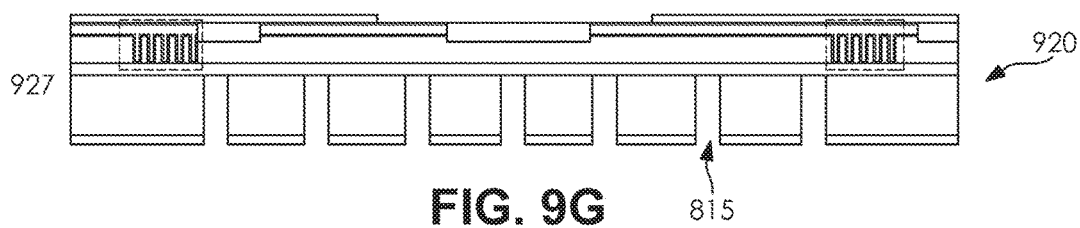
Figure 9H:
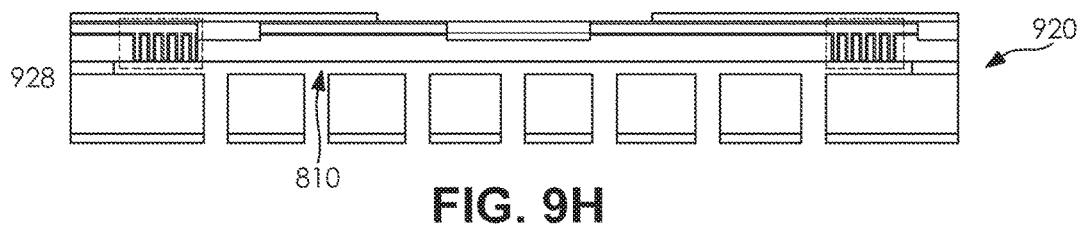

FIGS. 8A-8G demonstrate yet another variation of a fabrication process flow (referred to as "design C1" herein) 820 that uses a Si DRIE process to create the release holes 815 from the handling layer side of the SOI wafer in accordance with an embodiment of the present invention. Steps (a) 821-(b) 822 in this process, shown in FIGS. 8A-8B, are analogous to the steps shown in FIGS. 6A-6B, wherein DRIE trenches 302 are made followed by an alternating layering of nitride 107|oxide 105|nitride 107 on the top surface of the platform 820. Thereafter, in step (c) 823 depicted in FIG. 8C, thin-film electrical interconnects such as metal or poly-Si traces 306 are added on the top surface, which is the device layer side of the platform. In this process, unlike those described previously, oxide 105 deposited on the bottom surface, which is the handling layer side (reverse side) of the platform 820, is patterned to create release holes 815 in step (d), as illustrated in FIG. 8D. It should be noted that, optionally, the support arms may be patterned 308 and the Si 104 may be removed in step (e) 825, as shown in FIG. 8E. A subsequent oxide release 810 step (g) 827, shown in FIG. 8G, is completed from the reverse side of the wafer. Given that the oxide release 810 occurs from the handling layer side (reverse side) where the holes 815 have been made, the device layer side (top side) can be protected with photoresist during the release steps. This allows for a simple silicon nitride 107|oxide 105|nitride 107 refill process to be applied in step (b) 822 to the top side of the platform.

FIGS. 9A-9H show yet another variation of a fabrication process flow (referred to as "design C2" herein) 920 based on design C1 820 which also incorporates a standard CMOS 416 integration process. The steps involved in this exemplary process flow are identical to those of design C1 820 described above and shown in FIGS. 8A-8G with the exception of one additional intervening step wherein CMOS circuitry 416 is added to the platform. In this process, as can be seen in step (c) 923, shown in FIG. 9C, CMOS circuitry 416 is integrated onto the platform after the silicon nitride-oxide-nitride layer deposition step (b) 922, shown in FIG. 9B. The remaining steps (d) 924, (e) 925, (f) 926, (g) 927, and (h) 928, shown in FIGS. 9D-9H, are analogous to the steps respectively depicted in FIGS. 8C-8G.

Figure 10A:
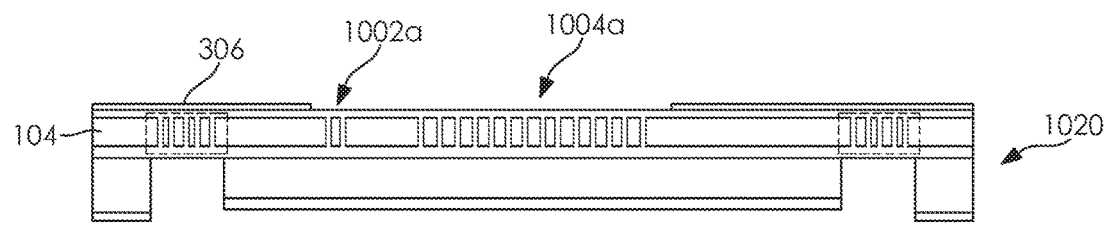
FIGS. 10A-10E illustrate alternative temperature sensor and heater configurations on a platform respectively in accordance with alternative embodiments of the present invention.
Figure 10B:
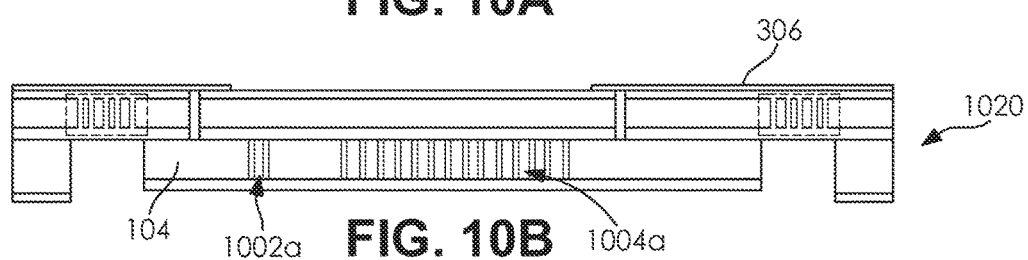
Figure 10C:
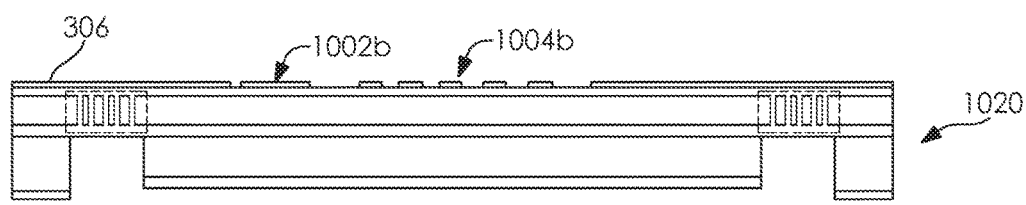
Figure 10D:
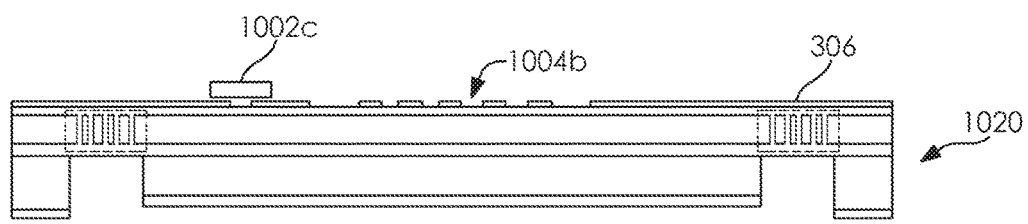
Figure 10E:
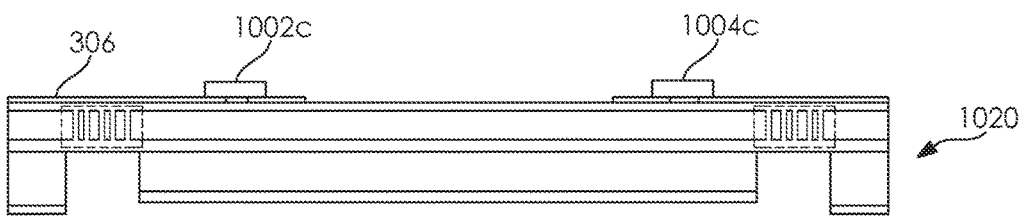
Figure 11A:
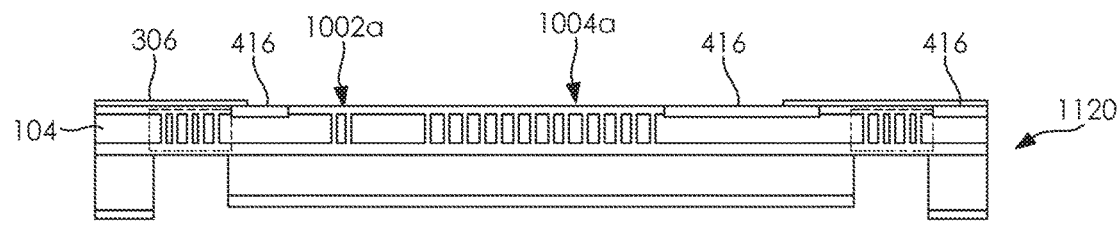
FIGS. 11A-11E illustrate alternative temperature sensor and heater configurations on a platform integrated with CMOS circuitry respectively in accordance with alternative embodiments of the present invention.
Figure 11B:
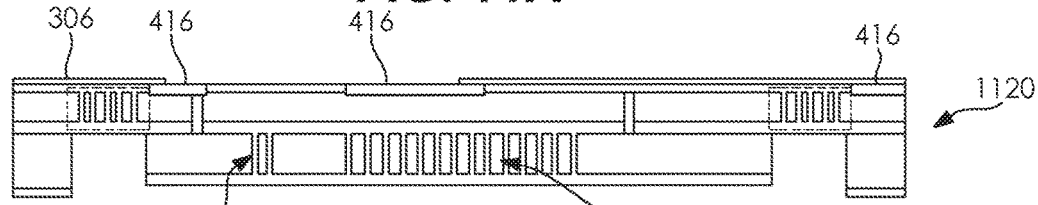
Figure 11C:
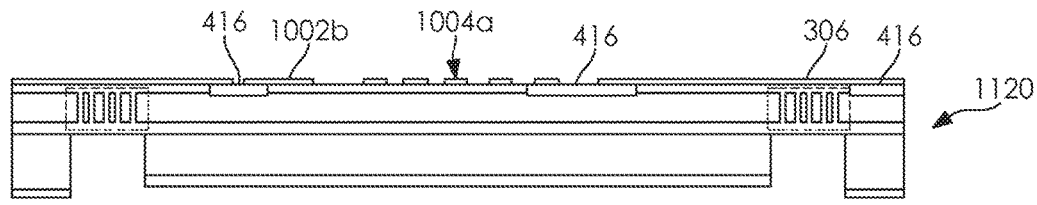
Figure 11D:
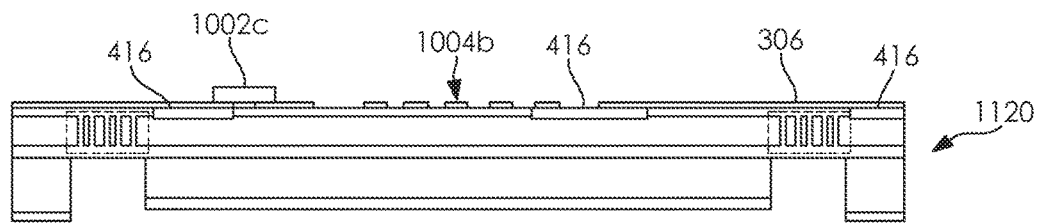
Figure 11E:
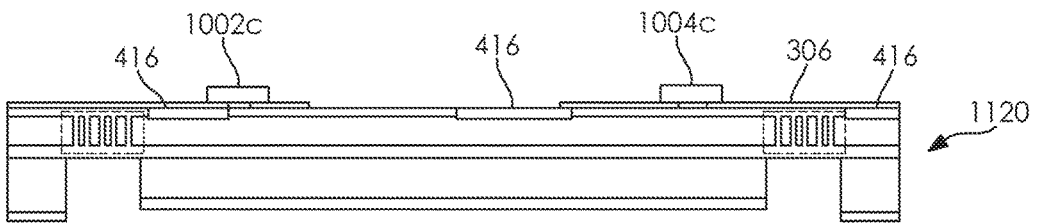

In a preferred embodiment of the ovenized platform, a temperature sensor 1002a and a heater 1004a can be incorporated into the Si 104 layer of the SOI wafer and shielded with the SiO$_2$ 105 refill process as can be seen in FIGS. 10A and 10B. In FIG. 10A both the temperature sensor 1002a and the bulk Si heater 1004a are displaced in an upper Si 104 layer of the platform 1020, while in FIG. 10B both are displaced in a lower Si layer of the platform 1020. In other preferred embodiments, different metals can be deposited during a metal deposition step in order to form the temperature sensor 1002b and heater 1004b as shown in FIG. 10C. For example, a thin Pt film is the preferred material commonly used to comprise the temperature sensor and heater although a variety of thin film metals can be used. Alternatively, thin film resistors comprised of two suitable materials such as Pt, Ni, Cr, or one of their alloys, with such resistors having different base resistances at a given temperature and different temperature coefficients of resistance (TCR), can be deposited to form a temperature sensor 1002b and provide a fixed-temperature voltage intersect when provided a constant current input on both branches of the circuit. A surface mounted temperature sensor 1002c resistor and/or heater 1004c can also be soldered onto the platform with a metal pad integrated onto the platform as shown in FIGS. 10D and 10E respectively. It should be obvious to and understood by one skilled in the art that all the different configurations of heater and temperature sensors are independent from the process flow designs (including but not limited to designs A1 320, A2 420, B1 520, B2 620, C1 820 and C2 920) and can be included in any variation thereof.

FIGS. 11A-11E show a variety of configurations of heater 1004a-c and temperature sensors 1002a-c on an ovenized platform 1120 integrated with CMOS circuitry 416. The embodiments of the platform 1120 shown in FIGS. 11A-11E are analogous to those shown in FIGS. 10A-10E, except that each also depicts the placement and configuration of CMOS circuitry 416 integrated on the platform 1120.

Figure 12G:
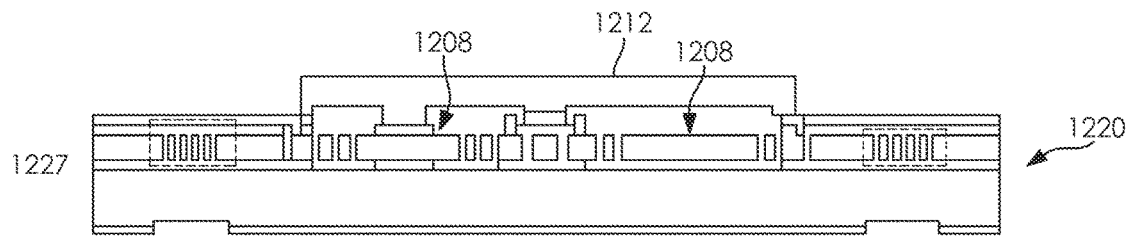
Figure 12H:
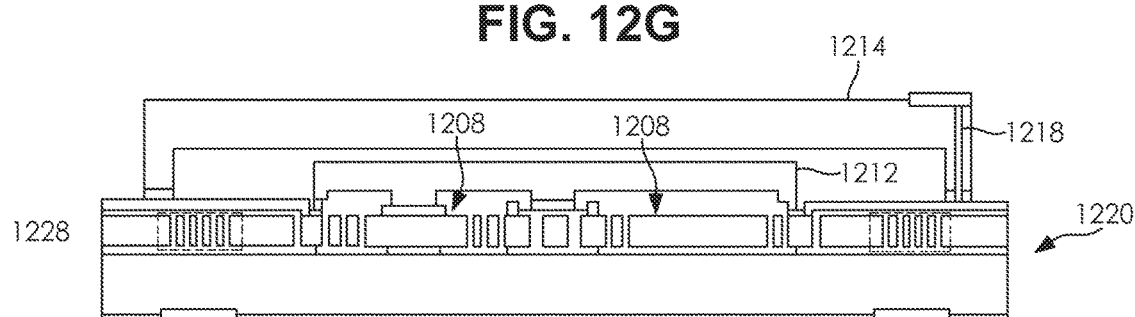
Figure 12I:
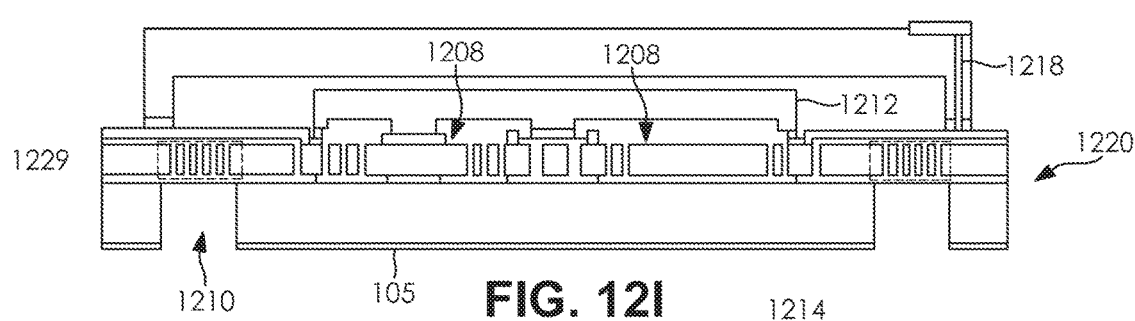
Figure 12J:
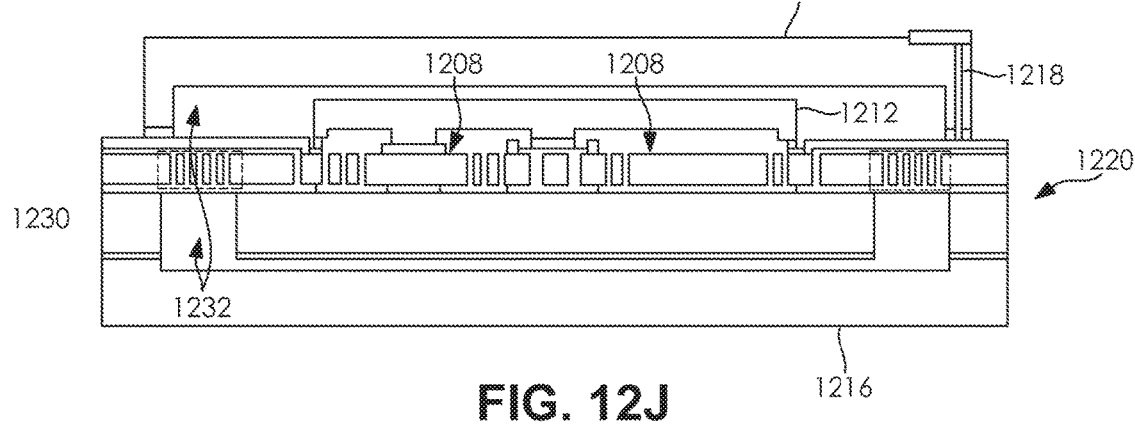
Figure 13A:
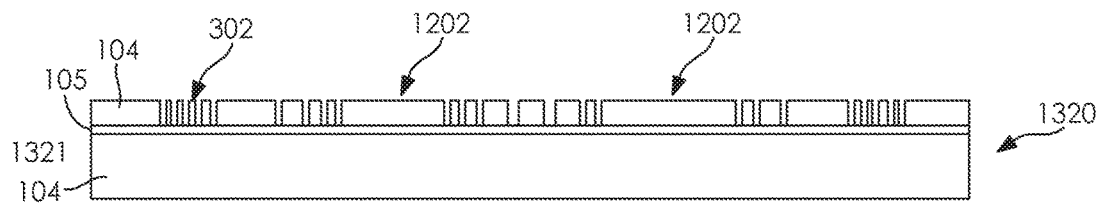
FIGS. 13A-13K show a cross-sectional view of the steps of a platform fabrication process flow integrating inertial sensors along with CMOS circuitry with an ovenized platform in accordance with another embodiment of the present invention.
Figure 13B:
Figure 13C:
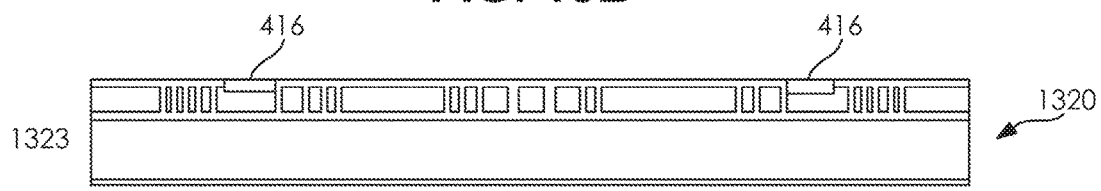
Figure 13D:
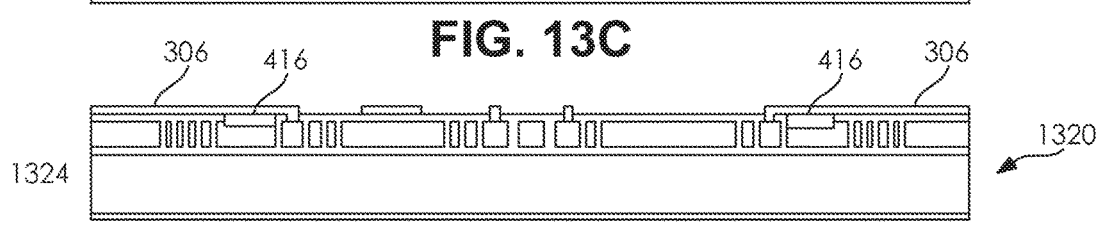
Figure 13E:
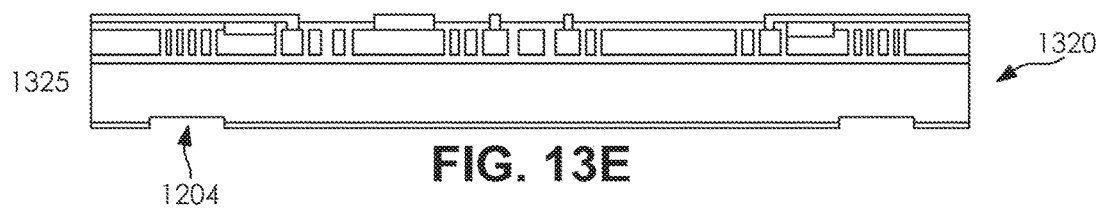
Figure 13F:
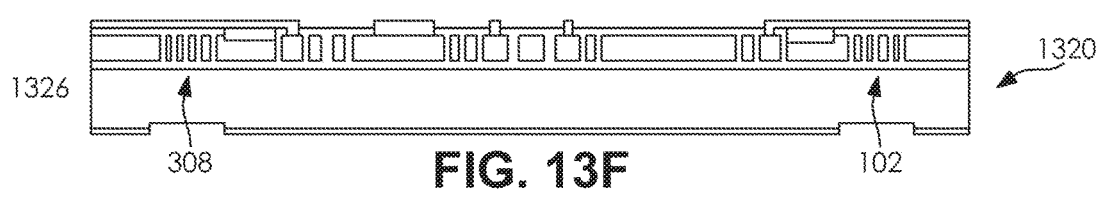
Figure 13G:
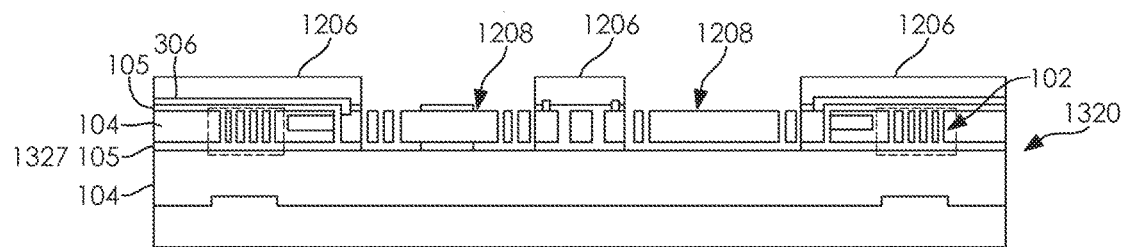
Figure 13H:
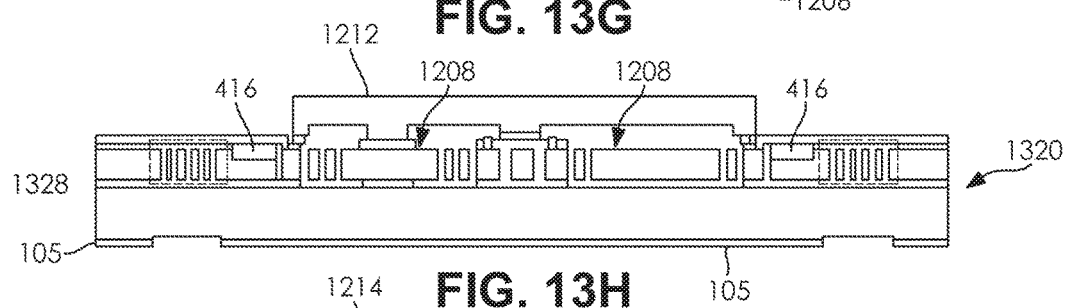
Figure 13I:
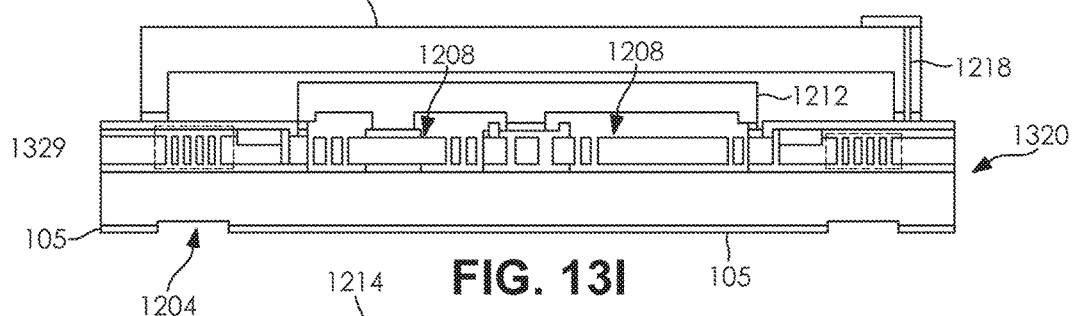
Figure 13J:
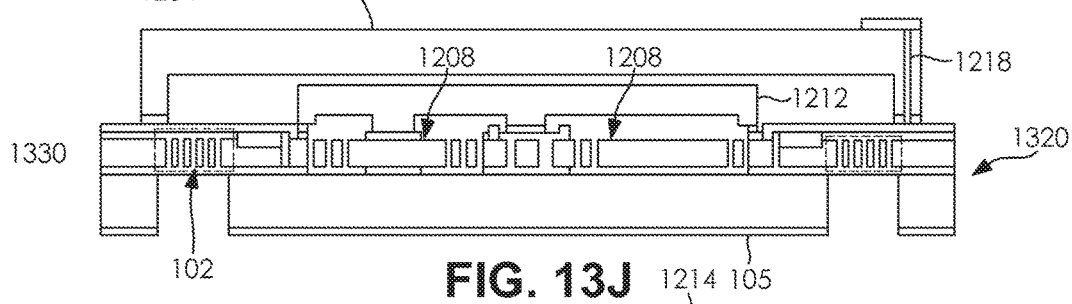
Figure 13K:
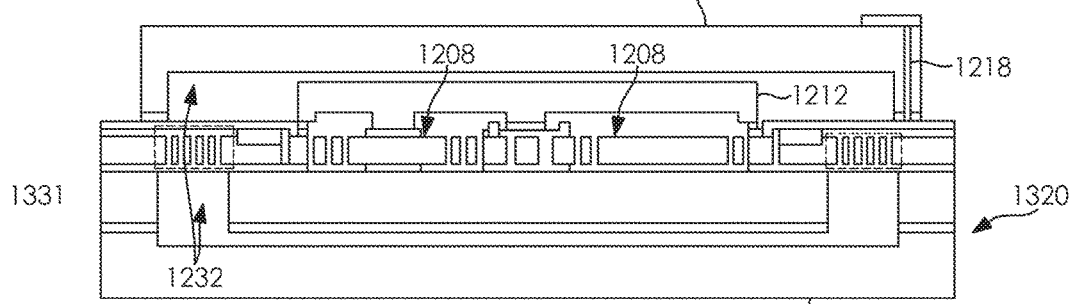

The fabrication process of the ovenized platform is compatible with standard MEMS fabrication processes as well. FIGS. 12A-12J show an exemplary SOI fabrication process of an ovenized platform 1220 integrated with inertial sensors 1202 in accordance with a preferred embodiment of the present invention. In this embodiment, the inertial sensor structures 1202 are defined together with the Si trenches 302 of the support arms 102 simultaneously in step (a) 1221, shown in FIG. 12A, and then refilled with SiO$_2$ 105 in step (b) 1222 as shown in FIG. 12B. Electrical interconnects 306 are added on the top surface of the platform 1220 in step (c) 1223, shown in FIG. 12C, after which silicon oxide patterning 1204 is added on the reverse side of the platform in step (d) 1224, shown in FIG. 12D, and optional DRIE patterning 308 may be optionally performed for the support arms 102 in step (e) 1225, shown in FIG. 12E. The inertial sensors 1208 are then released while the Si/SiO$_2$ support arms 102 are protected with photoresist 1206 as shown in step (f) 1226 seen in FIG. 12F. FIGS. 12G-12J illustrate how, with subsequent cap wafer bonding occurring as illustrated in steps (g) 1227, (h) 1228, and (j) 1230 (with different bonding cavity pressure and the creation of vacuum spaces 1232) as well as the support arms being released 1210 through DRIE in step (i) 1229, a fully integrated inertial sensor 1208 with an ovenized platform 1220 is fabricated on the wafer level. While this process flow only shows the integrated process with inertial sensors 1210 based the fabrication process flow of design A1 320 seen in the FIG. 3 series, this integrated process can similarly be applied to design B1 520 and C1 820 and should be obvious to and understood by one skilled in the art to be applicable to other process schemes as well. The top cap 1214 and bottom cap 1216 as well as the sensor cap 1212 can be made of any compatible materials although Si and glass are the most common materials suitable for wafer-level packaging. Vertical vias 1218 may be applicable in this integrated process and can be included in the top cap 1214 fabrication. When vertical vias 1218 are not used, however, wirebond pads can be formed in step (c) 1224, shown in FIG. 12C, and exposed after bonding the top cap 1214 in step (h) 1229 as seen in FIG. 12H.

Similarly, the standard CMOS process can be integrated into this process as well and such an exemplary fabrication process flow is shown in FIGS. 13A-13K in accordance with a preferred embodiment of the present invention. Steps (a) 1321, (b) 1322, (d) 1324, (e) 1325, (f) 1326, (g) 1327, (h) 1328, (i) 1329, (j) 1330, and (k) 1331 of this platform 1320 fabrication process is analogous to steps (a) 1221-(h) 1229 of the platform 1220 fabrication process with the exception of step (c) 1323 in this process wherein CMOS circuitry 416 is integrated into the platform 1320. While this process flow only shows the integrated process with inertial sensors based on the fabrication process flow of design A2 420, it should be obvious to and understood by one skilled in the art that this integrated process can likewise be applied to design B2 620 and C2 920 as well as other process schemes.

Figure 14A:
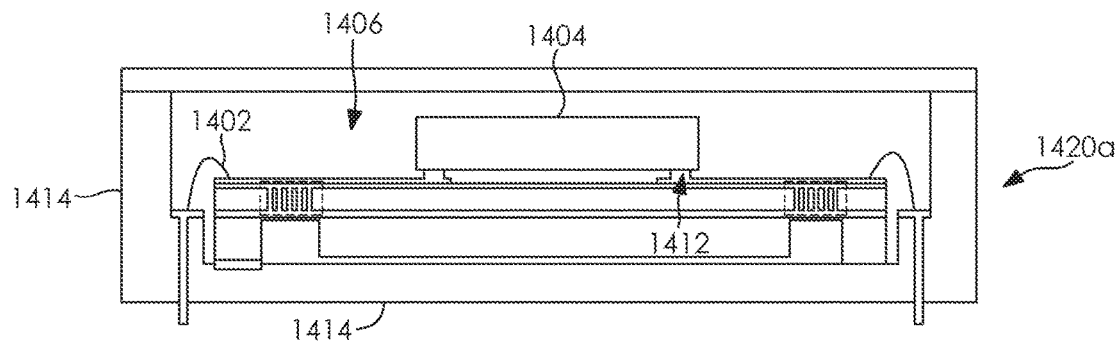
FIGS. 14A-14E show cross-sectional views of alternative ovenized platform packaging schemes respectively in accordance with alternative embodiments of the present invention.
Figure 14B:
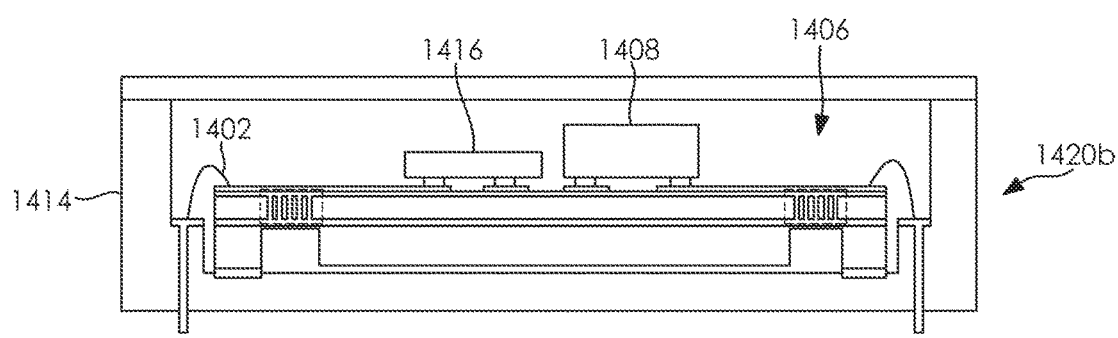
Figure 14C:
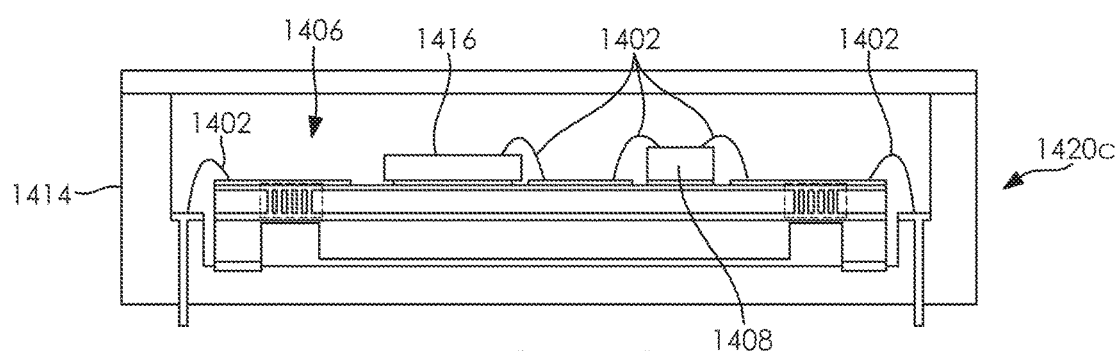
Figure 14D:
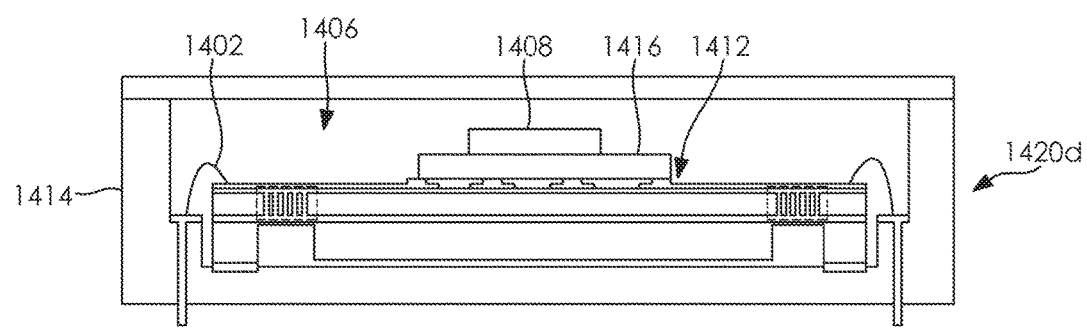
Figure 14E:
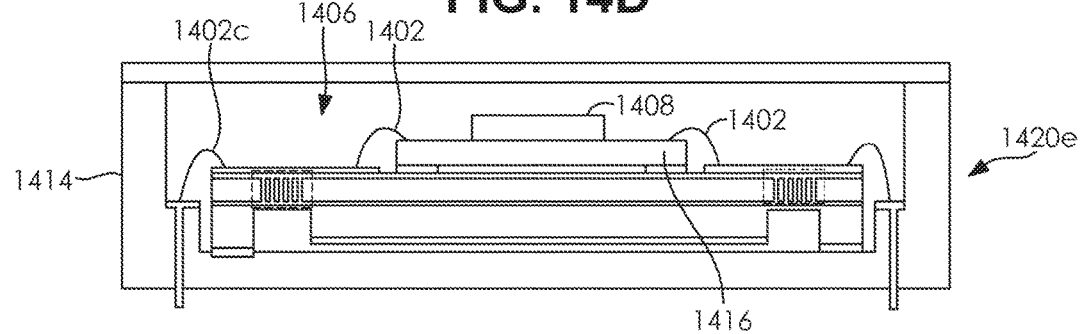

The ovenized platform and its fabrication processes are versatile and can be easily implemented with different packaging schemes. FIGS. 14A-14E illustrate several variations of packaging schemes 1420a-e, each with different sensors 1408, including both packaged sensors 1404 and unpackaged sensors, in accordance with alternative embodiments of the present invention respectively. While the drawings only demonstrate the inventive concept as applied to design A1 320, it should be obvious to and understood by one skilled in the art that the same concept can be applied to designs B1 520 and C1 820 as well as other ovenized platform process flow designs. FIG. 14A shows a packaged sensor (or a 3$^{rd}$ party inertial sensor/IMU) 1404 which can be bonded 1412 on the platform using flip-chip solder bonding or metal (or semiconductor) eutectic bonding in the first exemplary packaging scheme 1420a. The sensor 1404 and the platform are then packaged into an electronic chip package (which may be a standard ceramic package in this and other embodiments) 1414 through a vacuum seal process to create a vacuum cavity 1406 and provide thermal isolation. FIG. 14B shows the second exemplary packaging option 1420b a similar concept being utilized to integrate an application-specific integrated circuit chip (ASIC) 1416 and a Si sensor (which itself may be either a packaged or an unpackaged Si die) 1408 onto the platform which is then vacuum sealed in an electronic chip package 1414. Accordingly, when an unpackaged sensor die 1408 is used, this method only applies to those sensors which require vacuum packaging. FIG. 14C shows a similar scheme 1420c that attaches the ASIC 1416 and sensor 1408 onto the platform and connects them with wirebonding 1402 instead of metal solder or eutectic bonding. Similarly, when an unpackaged sensor die 1408 is used, this method only applies to those sensors requiring vacuum packaging. FIG. 14D shows a configuration 1420d where the sensor 1408 and ASIC 1416 are stacked on top of each other in which the positioning of the sensor 1408 relative to the ASIC 1416 can vary or be interchangeable (i.e. either the sensor 1408 on top of the ASIC 1416 or the ASIC 1416 on top of the sensor 1408) and may depend on the size of the respective dies. The stack may be connected by a bond 1412 on the platform using either flip-chip solder bonding or other metal or semiconductor eutectic bonding. FIG. 14E shows an alternative configuration to that of FIG. 14D where a wirebonding 1402 connection scheme that integrates the sensor 1408 and ASIC 1416 stack onto the ovenized platform is utilized instead of flip-chip solder bonding or other metal or semiconductor eutectic bonding.

Figure 15A:
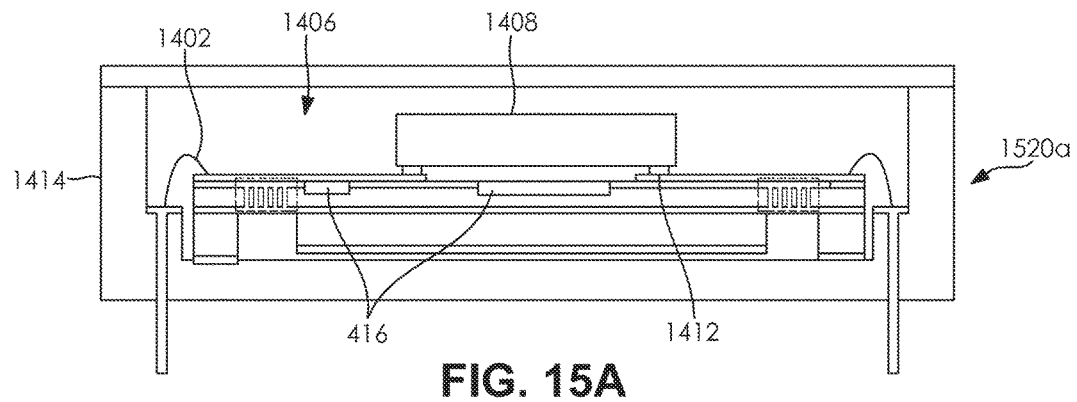
FIGS. 15A-15F show a cross-sectional view of alternative ovenized platform packaging schemes incorporating CMOS circuitry respectively in accordance with alternative embodiments of the present invention.
Figure 15B:
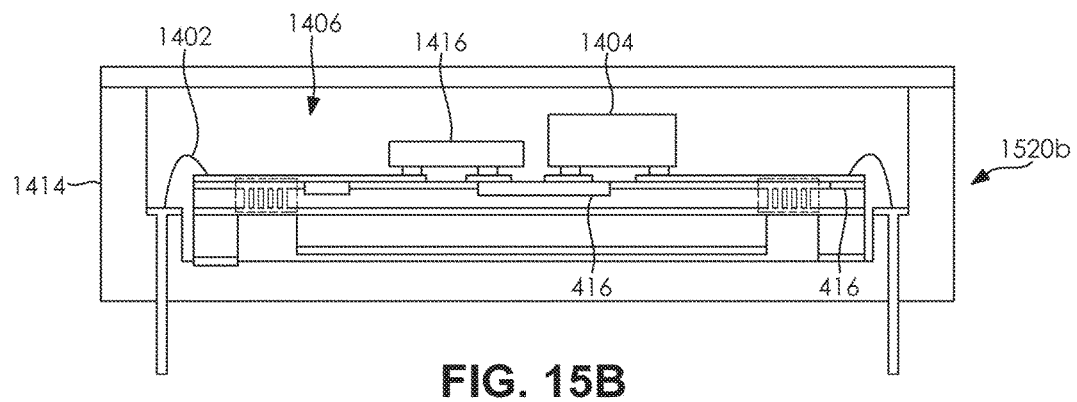
Figure 15C:
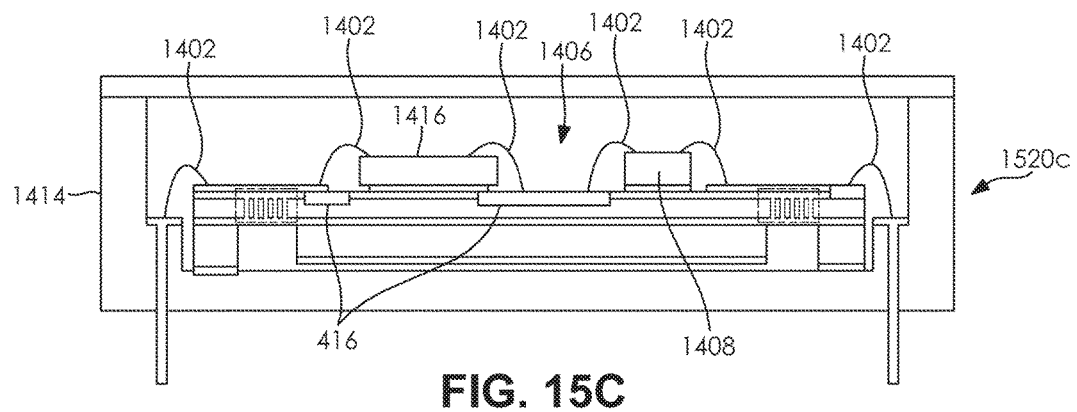
Figure 15D:
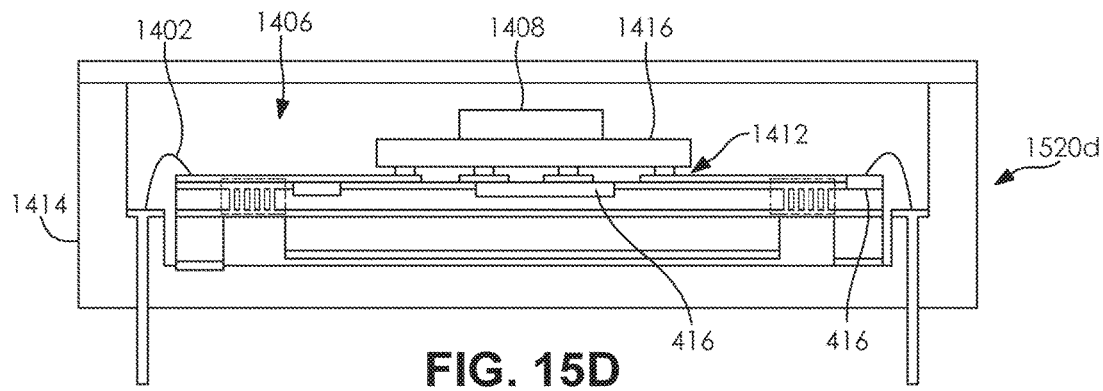
Figure 15E:
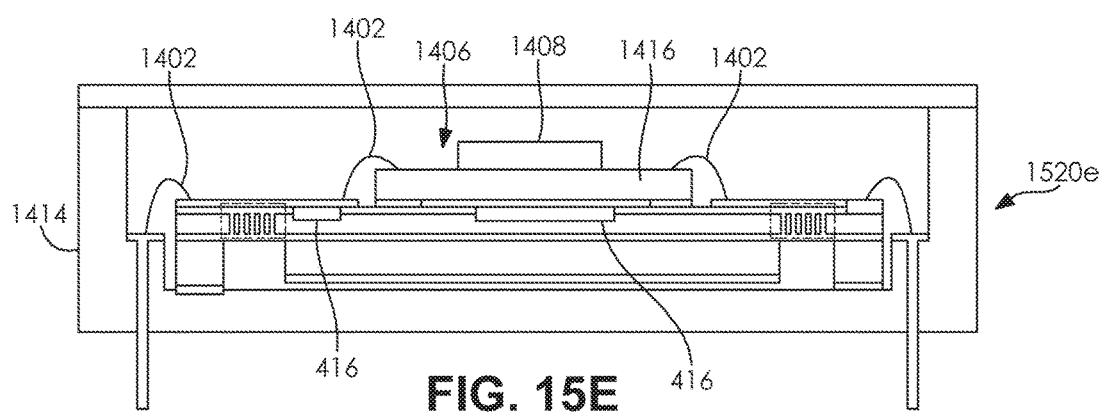
Figure 15F:
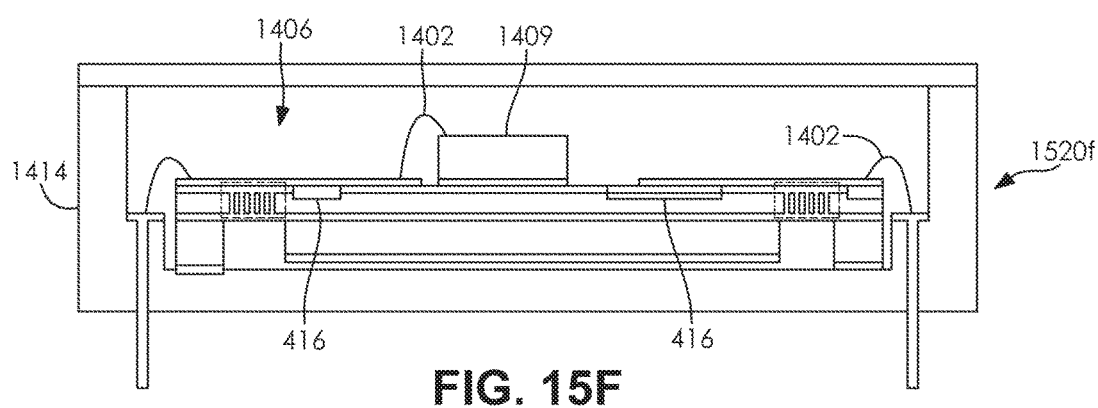

FIGS. 15A-15F show the package schemes 1520a-f using an ovenized platform integrated with CMOS circuitry 416 respectively in accordance with alternative embodiments of the present invention. While the drawings only demonstrate the inventive concept as applied to design A2 420, it should be obvious to and understood by one skilled in the art that the same concept can be applied to designs B2 620 and C2 920 as well as other ovenized platform fabrication process flow designs. FIG. 15A illustrates packaging scheme 1520a in accordance with an embodiment of the present invention wherein a packaged sensor (which may be a 3$^{rd}$ party inertial sensor/IMU) 1404 is bonded 1412 on the platform using flip-chip solder bonding or metal (or semiconductor) eutectic bonding after which the sensor 1404 and the platform are packaged into an electronic chip package (which may be a standard ceramic package) 1414 with a vacuum seal process to create a vacuum cavity 1406 and provide thermal isolation. FIG. 15B shows another scheme 1520b using a similar concept to integrate an ASIC 1416 and a Si sensor (which itself may be either a packaged or an unpackaged Si die) 1408 onto the platform which is then vacuum sealed in an electronic chip package. Accordingly, when an unpackaged sensor die is used, this method only applies to those sensors 1408 which require vacuum packaging. FIG. 15C shows a similar scheme 1520c that also attaches the ASIC 1416 and sensor 1408 onto the platform, but instead electrically connects them with wirebonding 1402. Similarly, as in the previous instances, when an unpackaged sensor die is used, this method only applies to those sensors 1408 requiring vacuum packaging. FIG. 15D shows yet another configuration 1520d stacking the sensor 1408 and ASIC 1416 on top of each other wherein the order or the positioning of the sensor 1408 relative to the ASIC 1416 can vary or be interchangeable (i.e. either the sensor 1408 on top of the ASIC 1416 or the ASIC 1416 on top of the sensor 1408) and may depend on the size of the respective dies. The stack may be attached by a bond 1412 on the platform using flip-chip solder bonding or metal (or semiconductor) eutectic bonding as illustrated in FIG. 15D or may alternatively use a wirebonding 1402 connection scheme that integrates the sensor 1408 and ASIC 1416 stack onto the ovenized platform as shown in FIG. 15E. FIG. 15F shows another alternative configuration 1520f scheme where the integrated sensor die (which may or may not contain integrated circuits in the die) 1409 is attached to the ovenized platform with all or part of the readout circuits integrated onto the platform.

Figure 16A:
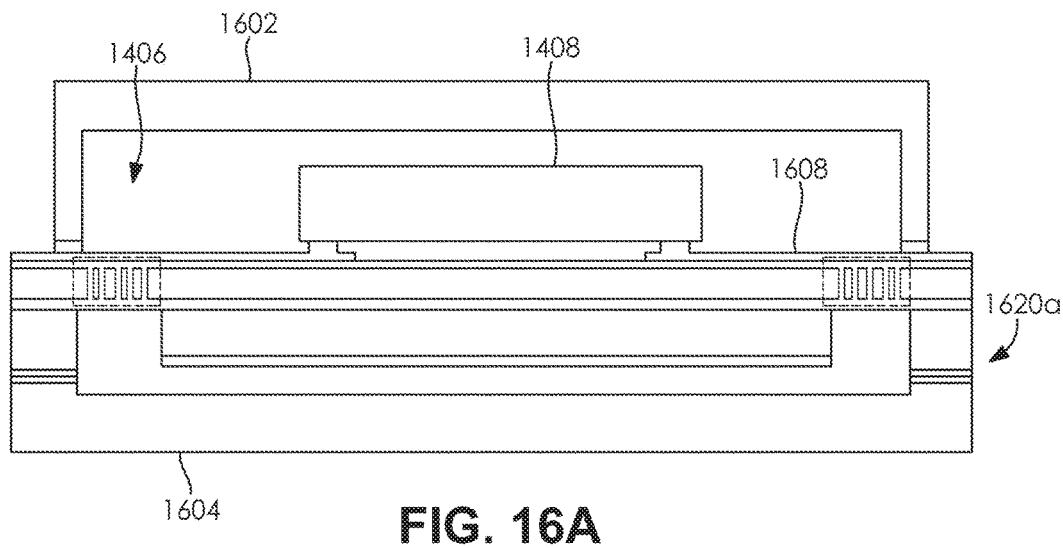
FIG. 16A illustrates a cross-sectional view of a wafer-level ovenized platform packaging scheme incorporating CMOS circuitry in accordance with an embodiment of the present invention.
Figure 16B:
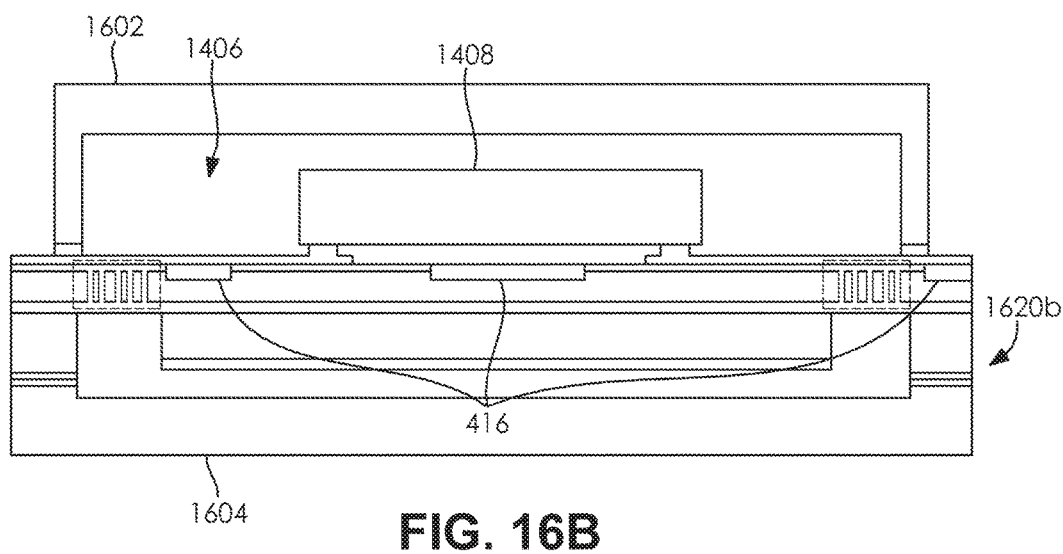
FIG. 16B illustrates a cross-sectional view of a wafer-level ovenized platform packaging scheme in accordance with another embodiment of the present invention.

The ovenized platform can also embody configurations of wafer-level packaging for individual sensor dies. FIGS. 16A and 16B each show the cross section of a variation of such a packaging scheme in accordance with preferred embodiments of the present invention. In this embodiment, the sensor (or device) 1408 can either be a fully packaged sensor (or device) or an unpackaged sensor (or device) otherwise designed to be compatible for this integration. The preferred embodiment of the ovenized platform depicted in FIG. 16A comprises a sensor 1408, a top cap 1602, and a bottom cap 1604. The sensor 1408, which may be a packaged sensor displaced entirely within a vacuum cavity 1406 defined by the top cap 1602 and the upper surface of the device layer side of the platform, may be attached by connection means 1412 using metal solder or eutetic bonding to the leads 1608 on the upper surface of the platform located on the device layer side (top side) thereof. Both the top cap 1602 and the bottom cap 1604 may be made of either Si, glass, or other materials suitable for encasing the platform-and-sensor combined structure. This integration may be accomplished on the wafer level with the assistance of a pick-and-place machine or through the utilization of other sorting approaches. Once the sensor (or device) 1408 is integrated onto the platform, the entire wafer is then bonded with a top cap 1602 and bottom cap 1604 after the support arm release. FIG. 16A shows the packaging scheme 1620a using platform design A1 320 and FIG. 16B shows the packaging scheme 1620b using platform design A2 420 incorporating CMOS circuitry 416. While the drawings only demonstrate the concept using design A1 320 and A2 420, it should be obvious to and understood by one skilled in the art that the same concept can be applied to design B1 520, B2 620, C1 820, C2 920 as well as other ovenized platform fabrication process flow designs.

It should be noted that the features illustrated in the drawings are not necessarily drawn to scale, and features of one embodiment may be employed with other embodiments as the skilled artisan would recognize, even if not explicitly stated herein. Descriptions of well-known components may be omitted so as to not unnecessarily obscure the embodiments.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

The invention claimed is:

1. An ovenized silicon platform comprising:
   at least one silicon layer;
   at least one silicon oxide layer;
   a hybrid Si/SiO$_2$ platform support structure,
   wherein said support structure is formed by depositing silicon oxide within trenches formed by a deep reactive ion etching of a silicon layer to create alternating layers of silicon and silicon oxide configured to thermally isolate the platform from temperature fluctuations; and
   at least one thin-film electrical interconnect displaced on the top surface of said platform.

2. The platform of claim 1 further comprising: at least one element selected from the group comprising CMOS circuitry, thermal sensor, heater, and inertial sensor.

3. The platform of claim 1 wherein the alternating layers of silicon and silicon oxide within the platform support structure are separated by a layer of silicon nitride.

4. The platform of claim 1 wherein the at least one silicon layer is a device layer of a silicon-on-isolator wafer.

5. The platform of claim 2 comprising at least one thermal sensor and at least one heater wherein said at least one thermal sensor and said at least one heater are each positioned within a layer of silicon.

6. The platform of claim 2 comprising at least one thermal sensor and at least one heater wherein said at least one thermal sensor and said at least one heater are each positioned on the top surface of said platform.

7. The platform of claim 1 wherein the thin-film electrical interconnect is a trace comprising metal or polysilicon.

8. A method for fabricating an ovenized silicon platform, said method comprising the steps of:
   deep-reactive-ion-etching trenches into a layer of silicon on one side of said platform;
   forming a recess on a side of the platform opposite to that of said trenches;
   depositing a layer of oxide onto a top layer of the platform to refill said trenches thereby having a patterned platform support structure of alternating layers of silicon and silicon oxide that provides thermal isolation for the platform;

attaching conductive traces onto a surface of the platform; and releasing said support structure.

9. The method of claim 8 further comprising the step of: integrating CMOS circuitry with the platform.

10. The method of claim 8 further comprising the steps of:

depositing a first layer of nitride onto a layer of silicon prior to depositing a layer of oxide on a top layer of the platform; and then depositing a second layer of nitride onto the layer of oxide to create a layer of oxide sandwiched between layers of nitride deposited on a top surface of the platform.

11. The method of claim 10 further comprising the steps of:

patterning the silicon oxide layer to create depressions therein; and encapsulating said depressions with nitride during the deposition of the second layer of nitride to create lateral etch stops.

12. The method of claim 8 further comprising the steps of:

defining at least one inertial sensor along with said trenches during the deep-reactive-ion-etching step;

releasing said at least one inertial sensor;

fitting a sensor cap over said at least one inertial sensor;

fitting a top cap on a top surface of said platform; and fitting a bottom cap on a bottom surface of said platform.

13. The method of claim 12 further comprising the step of: integrating CMOS circuitry with the platform.

14. The method of claim 8 further comprising the steps of:

attaching at least one of an unpackaged sensor or a packaged sensor to a top surface of the platform;

attaching said platform within an electronic chip package; and covering said package with a lid.

15. The method of claim 14 further comprising the steps of:

vacuum sealing said ceramic package.

16. The method of claim 14 where in the sensor attachment step is accomplished by either flip-chip bonding, eutectic bonding, or wirebond connection.

17. The method of claim 14 wherein the electronic chip package is ceramic.

18. The method of claim 14 further comprising the step of: integrating CMOS circuitry with the platform.

19. The method of claim 15 further comprising the step of: integrating CMOS circuitry with the platform.

20. The method of claim 16 further comprising the step of: integrating CMOS circuitry with the platform.

* * * * *